(12) United States Patent
Snelgrove

(10) Patent No.: US 9,112,524 B2
(45) Date of Patent: *Aug. 18, 2015

(54) SYSTEM AND METHOD FOR HIGH SPEED ANALOG TO DIGITAL DATA ACQUISITION

(71) Applicant: KAPIK INC., Toronto (CA)

(72) Inventor: William Martin Snelgrove, Toronto (CA)

(73) Assignee: KAPIK INC., Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/334,919

(22) Filed: Jul. 18, 2014

(65) Prior Publication Data
US 2015/0015428 A1 Jan. 15, 2015

Related U.S. Application Data

(63) Continuation of application No. 13/810,702, filed as application No. PCT/CA2011/000836 on Jul. 20, 2011, now Pat. No. 8,803,724.

(60) Provisional application No. 61/366,138, filed on Jul. 20, 2010.

(51) Int. Cl.
*H03M 1/12* (2006.01)
*H03M 3/00* (2006.01)
*H03M 1/06* (2006.01)

(52) U.S. Cl.
CPC .......... *H03M 1/1245* (2013.01); *H03M 1/0626* (2013.01); *H03M 1/0631* (2013.01); *H03M 1/0639* (2013.01); *H03M 1/12* (2013.01); *H03M 3/458* (2013.01); *H03M 1/1215* (2013.01)

(58) Field of Classification Search
CPC  H03M 1/0631; H03M 1/0626; H03M 1/1245
USPC .................................................. 341/155, 159
See application file for complete search history.

(56) References Cited

U.S. PATENT DOCUMENTS

| | | | |
|---|---|---|---|
| 4,968,988 A | 11/1990 | Miki et al. | |
| 5,654,698 A | 8/1997 | Snelgrove et al. | |
| 5,990,820 A * | 11/1999 | Tan | 341/161 |
| 6,329,939 B1 | 12/2001 | Swaminathan et al. | |
| 7,075,471 B1 * | 7/2006 | Gupta | 341/155 |
| 8,144,040 B2 * | 3/2012 | Messier et al. | 341/118 |
| 8,466,819 B2 | 6/2013 | Woodward et al. | |
| 8,519,875 B2 | 8/2013 | Straayer et al. | |
| 8,542,142 B2 | 9/2013 | Stein et al. | |
| 8,803,724 B2 * | 8/2014 | Snelgrove | 341/155 |
| 2006/0028197 A1 | 2/2006 | Quiquempoix | |

OTHER PUBLICATIONS

Parent U.S. Pat. No. 8,803,724, issued on Aug. 12, 2014 to Kapik Inc., Inventor: William Martin Snelgrove.

* cited by examiner

*Primary Examiner* — Brian Young
(74) *Attorney, Agent, or Firm* — Perry + Currier Inc.

(57) ABSTRACT

An analog to digital conversion system is disclosed which converts an analog signal to a digital representation thereof at a first sampling rate by distributing the analog signal to at least two signal paths, at least one signal path including a limiting mixer to mix the signal with a respective selected square wave and a smoothing (low pass) filter to filter the mixed signal before providing the mixed and filtered signal to a subconverter, the subconverter having a sampling rate less than the first sampling rate, and a digital matrix filter to combine the digital output of each subconverter to form a digital representation of the analog signal as sampled at the first rate.

20 Claims, 17 Drawing Sheets

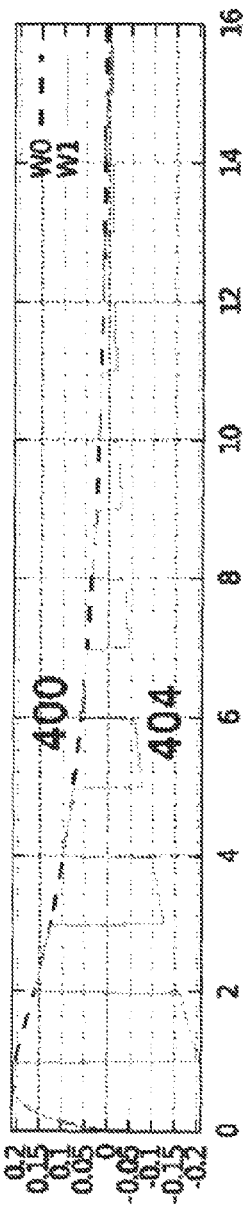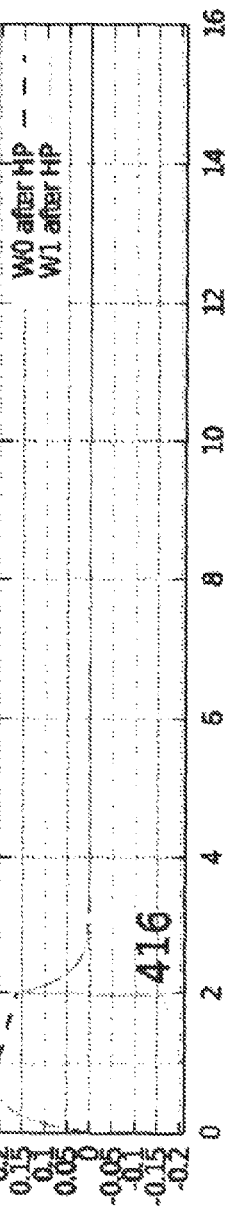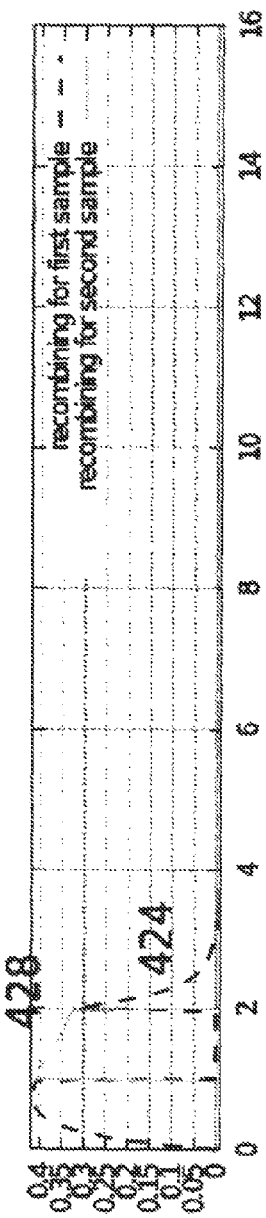
Fig. 11

SYSTEM AND METHOD FOR HIGH SPEED ANALOG TO DIGITAL DATA ACQUISITION

RELATED APPLICATIONS

This application is a continuation of U.S. patent application Ser. No. 13/810,702, filed Jan. 29, 2013, which claims the benefit of PCT International Application No. PCT/CA2011/000836, filed Jul. 20, 2011, which claims the benefit of U.S. Provisional Patent Application No. 61/366,138, filed Jul. 20, 2010 the entire contents of which are incorporated herein by reference.

FIELD OF THE INVENTION

The present invention relates to a system for conversion from an analog signal to a digital representation of that signal. More specifically, the present invention relates to an analog to digital conversion system combining multiple analog to digital subconverters sampling at a first rate to implement an analog to digital conversion system operating at a second rate, higher than the first rate, wherein a mixer-based front end distributes signal information to the subconverters and digital signal post processing is used to obtain the digital representation of the original signal.

BACKGROUND OF THE INVENTION

It is desirable to convert analog signals to digital form, typically because a physical variable is in analog form and processing of it is more practical if it is in a digital form such as a stream of values representing samples of the analog signal. Analog to digital converters are well known and are frequently implemented with a first sample and-hold or track-and-hold stage that converts a continuously-variable analog signal to a sequence of stable analog levels followed by a second quantization stage that converts these stable analog signals to digital form.

Many architectures and electronic circuits are known for converting analog to digital signals, but practical limitations of the electronic devices used to implement these systems limit sampling rate, accuracy and consume power. It is known that these considerations need to be traded off, so that, for example, sampling rate can be increased at a cost in decreased resolution and increased power consumption.

It is known to combine a pair of analog to digital converters that operate in alternation, so that the effective sampling rate of the pair is twice that of the individual converters and this is often referred to as a "ping-pong" architecture. It is known to generalize this principle to use large numbers of subconverters operating in rotation to implement converters operating at very high speeds. These are sometimes known as interleaved, or N-path, architectures.

In interleaved architectures it is necessary that each sample-and-hold stage of each subconverter path be capable of sampling the input signal at the bandwidth of the overall desired system, rather than at the lower bandwidth for which a lower-speed converter would typically be designed. This difficulty reduces the practical speed advantage available by using interleaved architectures. It is also known that when signals to be sampled have spectra that are not "white" (where, as is now to those of skill in the art, "white" means that the signal does not have correlation between samples) the correlation between consecutive samples reduces the effective information rate of the ensemble of samplers. Still another problem exists in that sample-and-hold circuits are difficult to implement in some technologies, such as with bipolar transistors.

It is desired to have a means of combining multiple subconverters to form a conversion system with a higher effective sampling rate than the sampling rate of the subconverters that does not suffer from the sampling difficulties of conventional interleaved systems.

SUMMARY OF THE INVENTION

It is an object of the present invention to provide a novel analog to digital conversion system which obviates, or mitigates, at least one disadvantage of the prior art.

According to a first aspect of the present invention, there is provided an analog to digital conversion system comprising a plurality of analog to digital subconverters, the conversion system having a higher sampling rate than the sampling rate of the subconverters, the system comprising: a signal distribution front end having at least two signal paths for an analog input signal; a limiting mixer in at least one of the signal paths to mix the analog signal with a mixing signal having at least two discrete levels; a smoothing filter in the at least one signal path to filter the mixed analog signal; an analog to digital subconverter in each signal path, the subconverters having a sampling rate less than the sampling rate of the analog to digital conversion system; and a digital matrix filter operable to combine the digital outputs from the subconverters in each path to produce an overall digital output signal corresponding substantially to the input analog signal sampled at the rate of the analog to digital conversion system.

Preferably, the signal distribution front end further comprises a clock generation and distribution system producing linearly independent signals at the filtered outputs of the limiting mixers. Also preferably, the a digital matrix filter employs orthogonal, or substantially orthogonal, codes to produce the output signal. Also preferably, the orthogonal codes are Walsh codes or the like. Preferably, the limiting mixer has two discrete states, although limiting mixers with three or more can be employed. In one embodiment, the subconverters can be sigma-delta converters.

The present invention provides a system for converting an analog signal to a digital representation thereof at a first sampling rate by distributing the analog signal to at least two signal paths, each signal path including a limiting mixer to mix the signal with a respective selected square wave and a smoothing (low pass) filter to filter the mixed signal before providing the mixed and filtered signal to a subconverter, the subconverter having a sampling rate less than the first sampling rate, and a digital matrix filter to combine the digital output of each subconverter to form a digital representation of the analog signal as sampled at the first rate.

BRIEF DESCRIPTION OF THE DRAWINGS

Preferred embodiments of the present invention now be described, by way of example only, with reference to the attached Figures, wherein:

FIG. 11 shows internal impulse responses of a system like that of FIG. 8 but wits a different filter fun ion thus having a more complicated second-order response;

DETAILED DESCRIPTION OF THE INVENTION

The present invention provides a novel analog to digital converter (ADC) system which combines analog to digital subconverters to achieve an analog to digital conversion system whose operating bandwidth is significantly higher than the sampling rate cit the subconverters employed. The conversion system comprises a signal distribution front end comprised of practical limiting mixers and finite-bandwidth buffers, a collection of subconverters, and a digital postprocessor operable to correct aliasing errors otherwise induced in the output signal by the signal distribution front end.

Figure 1:
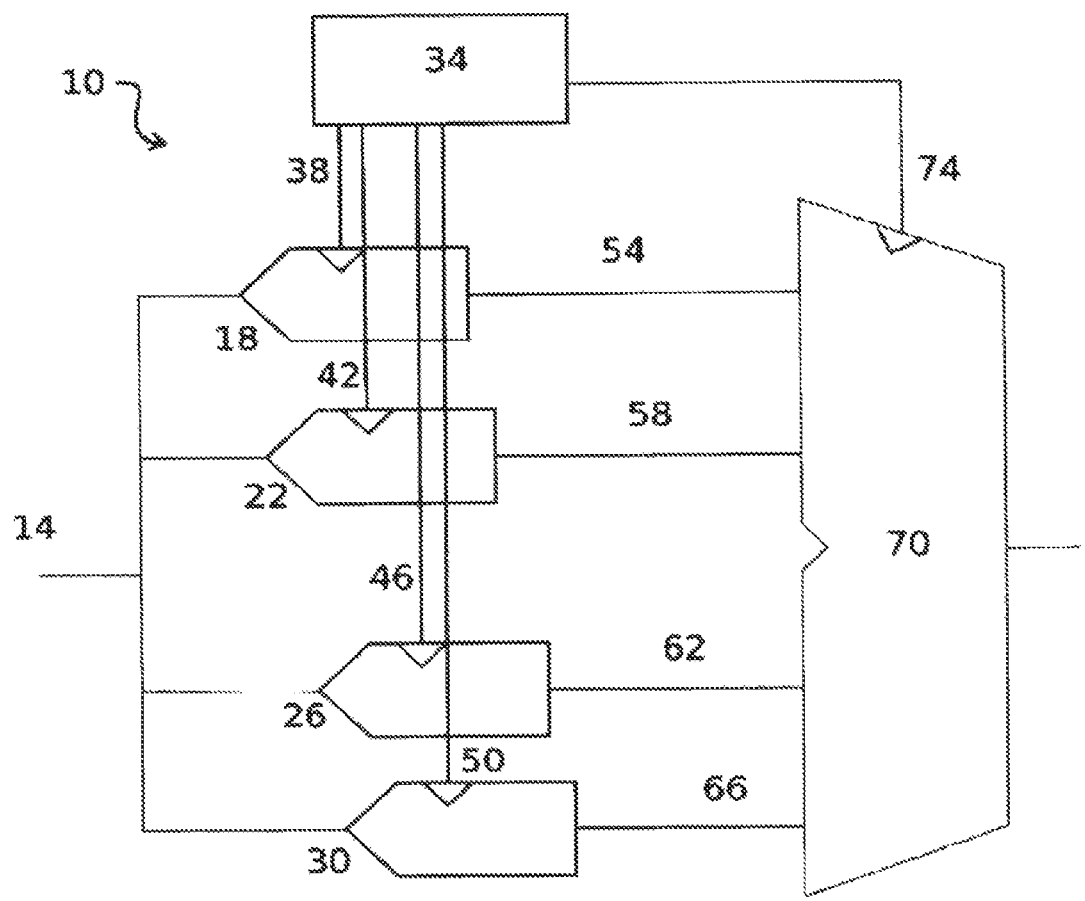
FIG. 1 shows a schematic representation of a prior art analog to digital converter comprising interleaved subconverters.

FIG. 1 shows a schematic representation of a prior art multipath analog to digital converter 10. An analog input signal 14 is applied to the inputs of a plurality of analog to digital subconverters (18, 22, 26 and 30). While multipath ADC 10 is shown as having four subconverters (18, 22, 26 and 30) it will be apparent to those of skill in the art that multipath ADC 10 can include more or fewer subconverters.

A multiphase clocking circuit 34 provides cloak signals 38, 42, 46 and 50 which define the times at which subconverters 18, 22, 26 and 30, respectively, sample analog input signal 14, producing uncorrected subconverter output streams 54, 58, 62 and 66 respectively. These subconverter output streams are multiplexed using multiplexer circuit 70, which is also clocked by a clock signal 74 generated by multiphase clocking circuit 34, into a single uncorrected multiplexed output stream 78.

It will be apparent to those of skill in the art that multiplexer circuit 70 may omitted, or modified, if multipath digital signal processing techniques are used to replace conventional single-path signal processing techniques in dealing with uncorrected multiplex output stream 78.

Figure 2:
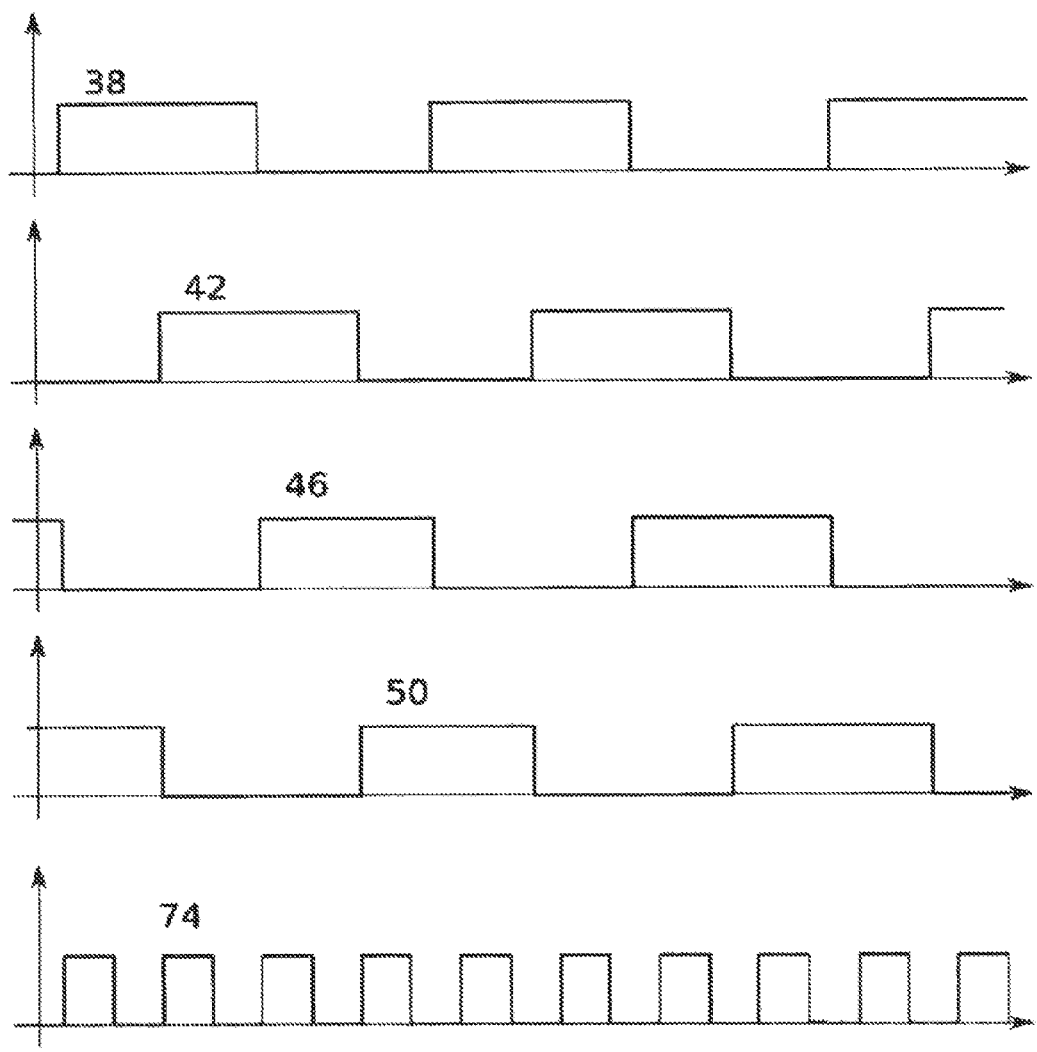
FIG. 2 shows prior art clock phases suitable for interleaving the analog to digital subconverters depicted in FIG. 1.

FIG. 2 shows a timing diagram representing prior art clocking for a multipath ADC such as ADC 10 of FIG. 1. Clock signals 38, 42, 46 and 50 are generated at nominal phase offsets of 360/N (degrees) (where in this example N is four). If, for example, subconverters 18, 22, 26 and 30 sample their input signals at the rising edge of their respective clocks, new samples will be taken at a constant rate N times greater than the sample rate of any individual subconverter. This is the desired behavior of art multipath ADC 10 described in FIG. 1 since relatively slow subconverters 18, 22, 26 and 30 are combined to provide a relatively fast overall system.

FIG. 2 also shows clock sign 74, which operates at the overall system sample rate—in this example, four times as fast as the clock of any subconverter. Nominally clocks 38, 42, 46 and 50 are evenly spaced in time, and often they have 50% nominal duty cycles. Deviations from equal spacing cause time-dependent errors in the reconstructed signal unless compensated for by techniques such as those described in U.S. provisional patent application 61/300,098, filed Feb. 1, 2010 and entitled "System and Method For Digitally Correcting Mismatches In Multipath ADCs" to the present inventor and assigned to the present assignee, and the contents of this prior application are incorporated herein, in their entirety, by reference. Even with the invention described in that provisional patent application, compensation is, in practice, imperfect and can cause amplification of quantization noise or enhance random timing errors known as "jitter". In practical implementations timing errors are induced both by systematic factors, such as propagation times for clock signals, and by factors that vary randomly from one device to another due to manufacturing variability.

Multiphase clocking circuits suitable to provide these signals are well known in the prior art, with many known variants. Further, it is well known that in practical systems this timing cannot be generated precisely and that, in consequence, the system of which the multipath ADC forms part is subject to errors which it may often be desirable to reduce or eliminate.

These time-interleaved converters are typically described in the time domain, but can be analyzed in the frequency domain. From a frequency-domain point of view, a system with N time-interleaved converters suffers from "aliasing" of N input frequencies to each output frequency in each subconverter channel. For example, in a so-called "ping-pong" system (interleaving with N=2) in which each channel is sampling at 1 GHz, input frequencies below 500 MHz are in the first Nyquist zone of each converter while frequencies from 500 MHz to 1 GHz are in the second Nyquist zone of each subconverter and it is not possible to distinguish inputs at (e.g.) 400 MHz from inputs at 900 MHz by looking at the outputs of either subconverter on its own. When looking at the pair, though, is possible to distinguish these two cases because the relative phases as measured by the two subconverters differ. If the clocks are evenly spaced, as per FIG. 2, then the digital signal processing needed to mathematically correct the alias ambiguity consists simply of time-interleaving the outputs. However, in the practical case where the channels do not match perfectly, this simple interleaving does not completely eliminate aliases in the overall output.

Figure 3:
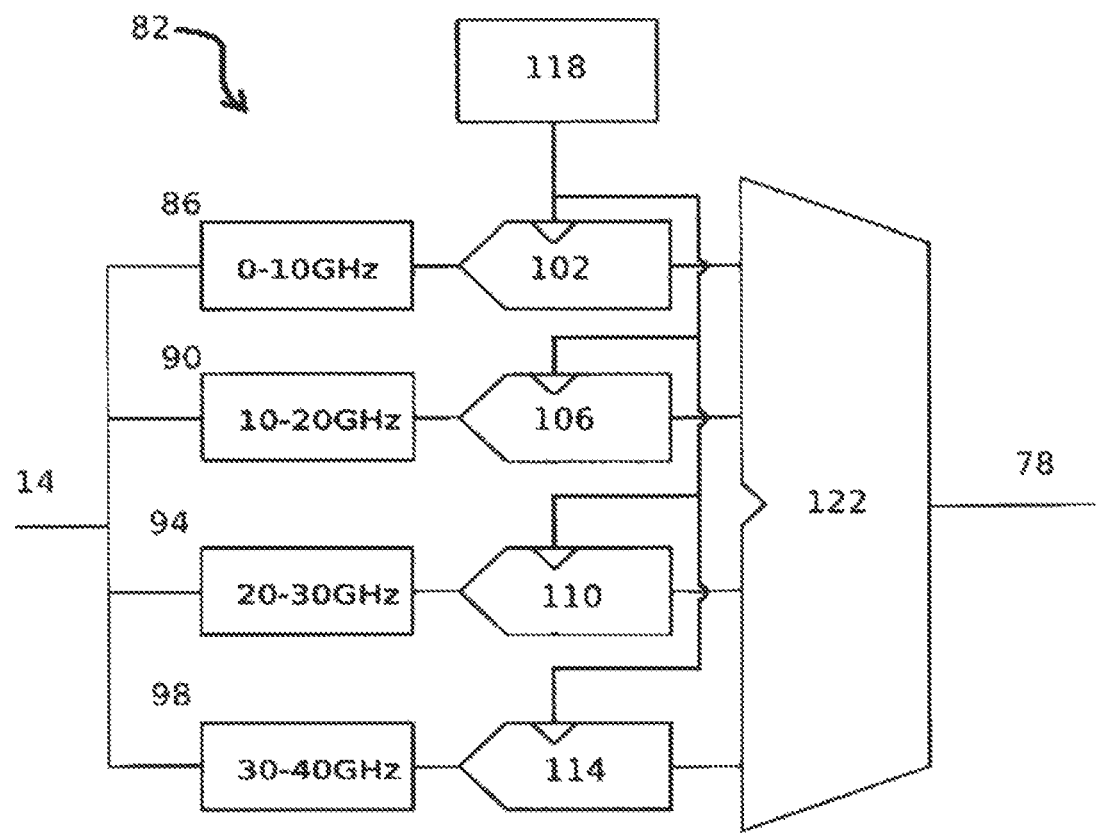
FIG. 3 shows a prior art analog to digital converter comprising subconverters combined by frequency division.

The time-interleaved approach of FIGS. 1 and 2 can be described as partitioning of a signal among subconverters by decimation of the signal in the time domain, whereas FIG. 3 shows one type of prior art analog to digital converter system 82 comprising subconverters combined by frequency division. More specifically, when converter 82 is an 80 GHz ADC, input signal 14 applied to analog to digital converter system 82 is distributed to a plurality of filters 86, 90, 94 and 98, each having substantially distinct passbands (In the illustrated example, 0-10 GHz, 10-20 GHz, 20-30 GHz and 30-40 GHz), and thence to a plurality of corresponding subconverters 102, 106, 100 and 114, which are clocked by clock generator 118. The outputs of subconverters 102, 106, 110 and 114 are combined digitally in summer 122, which includes digital upsampling and frequency conversion, to provide output signal 78. While the number of bands shown in the Figure is four, one skilled in the art will appreciate that any number of bands may be used.

This particular implementation is easy to describe but not practical for several reasons, including that, as shown, it requires infeasible "brick-wall" filters (filters that cut of out-of-band signals in an ideal manner) and that the highest-frequency signal components are heavily subsampled, which is known to make design of their sampling circuits more difficult.

Figure 4:
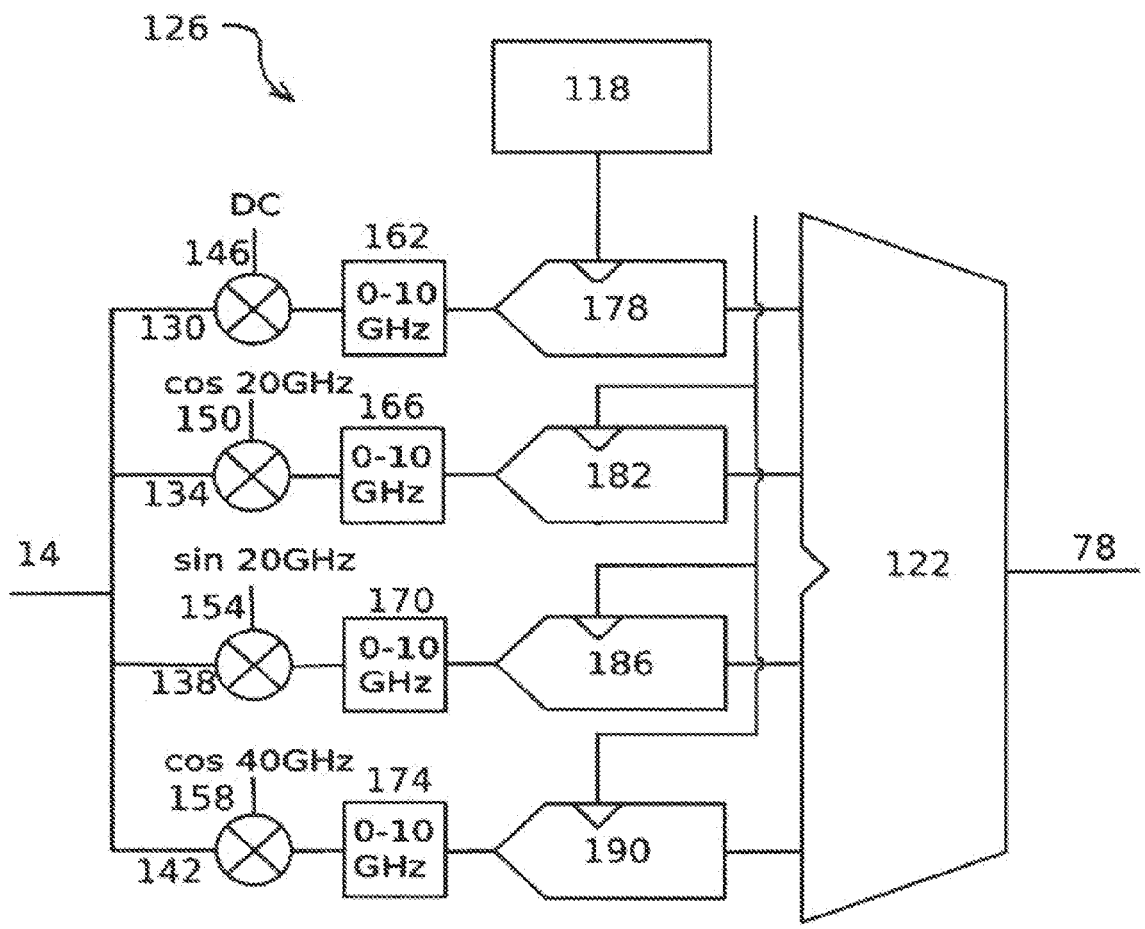
FIG. 4 shows a schematic representation of a prior art implementation of the converter of FIG. 3 using mixers.

FIG. 4 shows a prior art implementation of an ADC structure closely related to that of FIG. 3 but which employs mixers (130, 134, 138 and 142) to implement the desired filtering, is somewhat more practical in that all subconverters now operate in the first Nyquist zone (i.e. without recourse to subsampling). This confers a double advantage: avoidance of subsampling (which is known to cause practical difficulties) and uniformity of requirements on the subconverters, which latter, in turn, makes matching more practical. On the other hand this design now requires each signal path to include a mixer and still nominally requires brick-wall filters. As will be shown below, this constraint can in fact be relaxed.

The mixers in FIG. 4 are shown with a multiplication symbol because an idealization of a mixer is as a multiplier. One skilled in the art will recognize that a variety of functions that approximate multiplication may be used in place of an ideal multiplier.

In more detail, FIG. 4 shows an analog to digital converter system generally at 126, ADC system 126 distributes its analog input signal 14 to a plurality of mixers 130, 134, 138 and 142. These mixers are also driven by corresponding local oscillator signals and specifically, in the illustrated embodiment, 146 (DC), 150 (cos 20 GHz), 154 (sin 20 GHz) and 158 (cos 40 GHz), and their outputs drive corresponding filters 162, 166, 170 and 174 and respective subconverters 178, 182, 186 and 190 which are clocked by signals from clock generator 118. The outputs of the subconverters are combined, typically by digital mixing and summation, in combiner 122 to provide output digital signal 78. While the number of channels shown in the Figure is four, one skilled in the art will recognize that the architecture can be generalized to any number of channels.

The particular case N=2 for the structure of FIG. 4 is well known and widely used for converting narrowband signals at high frequencies. Mixing down to baseband relaxes requirements on sampler bandwidth and clock jitter (though phase noise in mixer clocks is still critical), and the need for brick-wall filters is generally removed by the expedient of oversampling in the subconverters.

However, even the N=2 case is rare for converting broadband signals, partly because the need for oversampling reduces the value of the technique—if 2× oversampling is used, then the subconverters must each be as fast as the high-speed converter which it was desired to avoid.

The multiband case, N>2, adds several complexities and, to the present inventor's knowledge, is not in use. One key difficulty comes from a practicality of mixers: that in practice, they usually multiply the input by a square wave, rather than a sine wave. In some cases, this is to optimize noise and linearity, and in other cases because the circuit used to construct the mixer is based upon switches and these are often referred to as limiting mixers. As used herein, the term limiting mixer is intended to comprise any mixer wherein the local oscillator is limited to a small number of discrete states (e.g. −1, +1 or −1, 0 +1). While in the discussion which follows only a two state limiting mixer is explicitly described, it will be apparent to those of skill in the art that a three state limiting mixer can also be employed, as can limiting mixers with higher numbers of states if desired.

As is known, multiplying by a square wave adds terms at the odd harmonics, which can cause aliasing and thus, the 20 GHz mixers in FIG. 4 would in practice mix a 50 GHz signal inband, as well as the desired 10-30 GHz. For a four-path system this might be acceptable, because the 50 GHz signal would anyway be expected to cause aliasing, but a system with more bands would alias in-band to in-band signals and hence behave incorrectly.

It is also possible to decimate the signal in an orthogonal, or substantially orthogonal, code sequence domain, such as a Walsh code (orthogonal) or Gold Code (substantially orthogonal), rather than in time or frequency domains. While the following discussion refers only to Walsh codes, the present invention can be employed with other orthogonal codes or with substantially orthogonal codes, such as Gold codes or the like and such implementations are intended to be within the scope of the present invention.

Walsh matrices are orthogonal with all elements either ±1, which matches the clipped behaviour of practical mixers: and the N-dimensional Walsh transform of a sampled signal can be thought of as multiplying groups of N samples by a Walsh matrix to get N Walsh-transformed values. A system for unsampled signals can be derived from this by replacing the dot-products corresponding to individual rows of the Walsh matrix with mixers having appropriate square-wave local oscillator (LO) inputs and an integrate-and-dump element.

Figure 5:
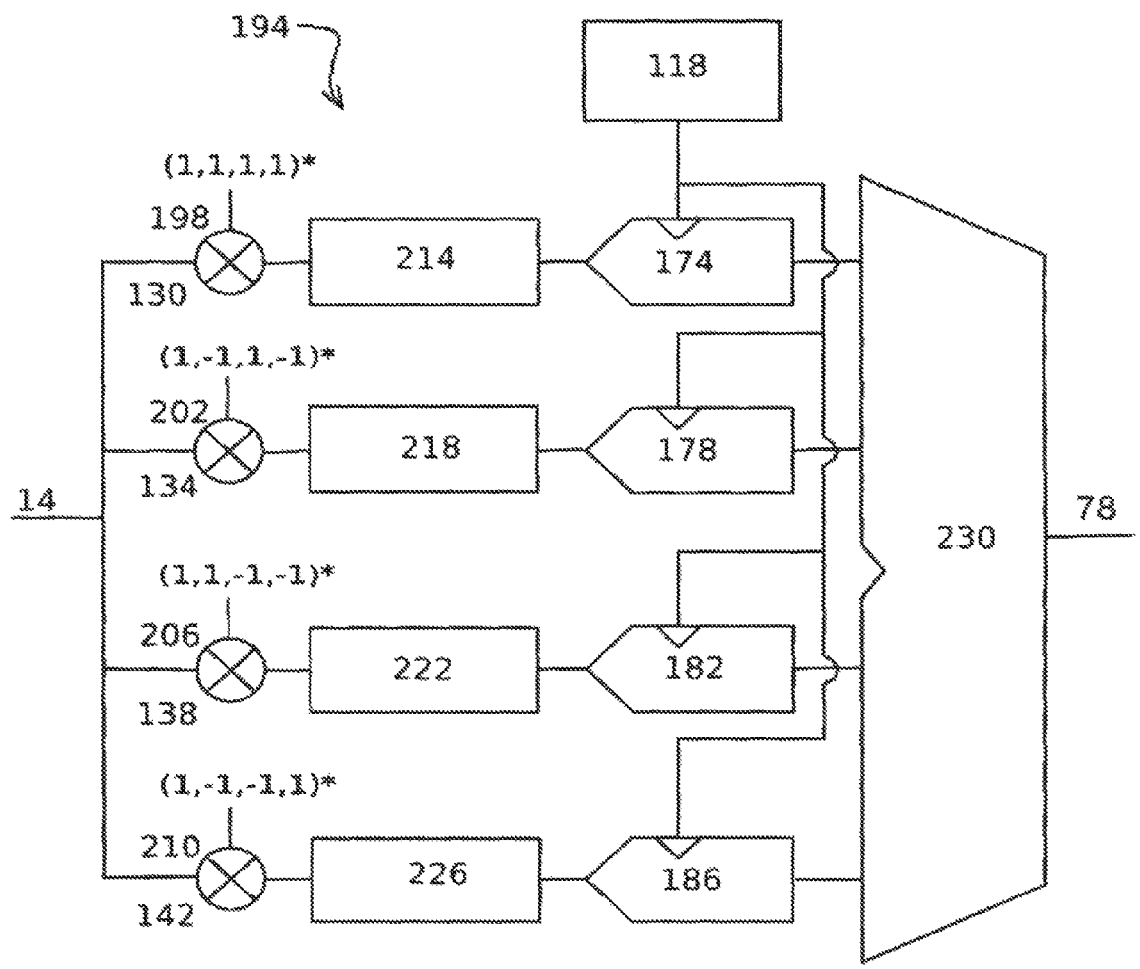
FIG. 5 shows a schematic representation of a prior art converter employing Walsh code decomposition of the input signal.

FIG. 5 shows a prior art system for sampling with Walsh decomposition of the input signal by means of mixing plural copies of the input signal with square waves and passing the resulting mixed signals through integrate-and-dump circuits. An analog to digital converter system is shown generally at 194. Its analog input signal 14 is distributed to a plurality of mixers 130, 134, 138 and 142. These mixers are also driven by corresponding local oscillator signals 198, 202, 206 and 210, and their outputs drive corresponding integrate-and-dump circuits 214, 218, 222 and 226, which in turn drive corresponding subconverters 174, 178, 182 and 186, which are clocked by clock signals from clock generator 118. The outputs of the subconverters are combined in Walsh combiner 230 to provide digital output signal 78.

While the number of channels shown in FIG. 5 is four, one skilled in the art will recognize that any number of channels may be used. While the mixers shown are represented as multipliers, one skilled in the art will recognize that because the local oscillator signals are two-level, a wide variety of mixer circuits may be used, and that for many of these circuits a sinusoid sufficiently large to clip the local-oscillator input will have substantially the same effect as a square wave and may be more practical to generate and distribute. One skilled in the art will also recognize that any set of linearly independent signals may be substituted for the Walsh signals, and that orthogonal set of signals (such as Walsh) are desirable.

FIG. 5 strongly resembles the mixer-based frequency-decimation system of FIG. 4 except that the mixing is performed with a sequence of ±1's and the filtering is performed with an integrate-and-dump circuit element. It should be noted that multiplying by a sequence {1, −1, 1, −1} (i.e.—the path through mixer 134) clocked at a frequency $f_s$, mixes the input with a square wave at $f_s/2$, which is similar to the path through mixer 142 of FIG. 4. Similarly the sequences {1, 1, −1, −1} and {1, −1, −1, 1} (respectively the paths through mixers 138 and 142 of FIG. 5) are at $f_s/4$ and in quadrature, similar to the paths through mixers 134 and 138 of the system of FIG. 4.

As is known, an integrate-and-dump circuit is mathematically equivalent to preceding an ideal sampler with a linear filter having a boxcar (h(t)=1 only for 0<t≤T, otherwise h(t) =0) impulse response. This pre-filters the signal with a sin c(t/T) response, which has a small (3.9 dB) in-band droop, 6 dB/octave rolloff (similar to the plot of FIG. 10), and notches at multiples of the sampling rate. This pre-filtering reduces sensitivity to jitter and aliasing of out-of-band signal and circuit noise.

High-speed implementation of an integrate-and-dump circuit is difficult with this architecture, since the dump function must be, in principle, infinitely fast, though it is possible to use a ping-pong approach to solve this problem.

The key elements that are addressed in the various multi-path architectures above are mixers, filters and samplers; and the problem is to find an architecture that can be implemented well with practical circuits.

Figure 6A:
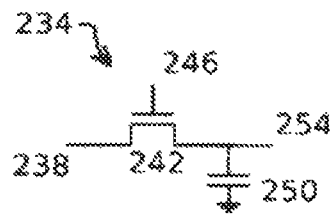
FIGS. 6b and 6c show schematic representations of known sample-and-hold circuits and sample-and-hold circuits with input buffering having limited bandwidth.
Figure 6B:
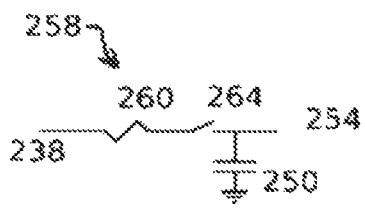
Figure 6C:
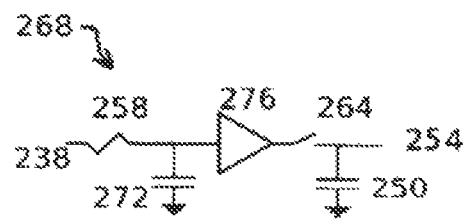

FIGS. 6a, 6b and 6c show prior art track-and-hold circuits and track-and-hold circuits with input buffering having limited bandwidth. FIG. 6a shows a basic MOSFET-C track-and-hold circuit 234 that, at present, dominates design practice. In circuit 234, an input signal 238 is applied to one side of the channel (i.e. the source or drain) of a MOSFET 242 while a signal 246 operable to cause switching of said MOSFET 242 is applied to its gate. The other side of the channel (drain or source) of MOSFET 242 is applied to a sampling capacitor 250 and sampled output 254 is taken as the capacitor voltage when MOSFET 242 is in the "OFF" state.

For analysis purposes, basic MOSFET-C track-and-hold circuit 234 is typically modeled with the linear time-varying circuit of FIG. 6b, shown generally at 258, in which MOSFET 242 is modeled as a switch 264 having series on-resistance 260. Thus input signal 238 is modeled as being applied through on-resistance 260 to ideal switch 264. In the "on" state of switch 264, sampling capacitor 250 is charged towards input 238, hence tracking its value, while in the "off" state the output voltage 254 on sampling capacitor 250 is held at the last value tracked. Because the on-resistance is non-zero there is tracking error, in which output voltage 254 tracks (and therefore holds) a lowpass ("lagged") version of input signal 238.

FIG. 6c shows, a buffered track-and-hold circuit 268. Input signal 238 is applied through a lowpass filter, comprising resistor 258 and filter capacitor 272, to the input of a buffer 276, which in turn drives a track-and-hold of the type described in FIGS. 6a and 6b comprising sampling switch 264 and sampling capacitor 250, again producing held voltage 250. A buffered track-and-hold implementation has the advantage over the unbuffered type of isolating its input from switching transients. Because sampling is a special case of mixing, adding a mixer to the filter/sampler of FIG. 6 is practical.

Figure 7A:
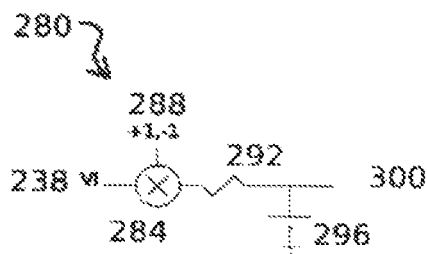
FIGS. 7a, 7b and 7c show schematic representations of known circuits combining mixing of an input signal with a square wave, filtering and sampling.

FIG. 7a shows a model of a common mixer arrangement, in which alternating sides ±Vi of a balanced signal are sampled.

Figure 7B:
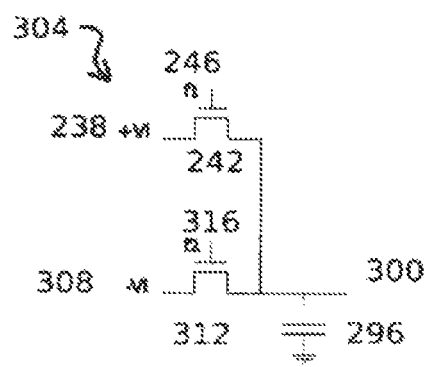

FIG. 7b shows a circuit for the model of FIG. 7a as an ideal square-wave LO mixer (restricted to a square-wave LO) followed by an RC filter. The mixer circuit lacks a hold phase— its output signal varies in all clock phases, whereas a simple sampler "holds" when the clock is low. Adding a buffer and a sampler gives the circuit shown in FIG. 7c, in which the buffer and sample/hold can be expected to have finite bandwidth. If each component of this circuit is first-order, then the conventional mixer/sampler circuit contains an implicit third-order filter.

In more detail, FIG. 7a shows a simplified model of a circuit 280 combining mixing of a signal 238 in a mixer 284 with a square wave 288 and filtering by a lowpass circuit comprising resistor 292 and capacitor 296 to provide a mixer output signal 300.

FIG. 7b shows an embodiment of the circuit 304 modeled at 280, wherein input signal 238 is augmented by providing a phase-inverted input signal 308. The original input signal 238 is switched to load capacitor 296 through MOSFET 242, which in turn is controlled by clock signal 246; the phase-inverted input signal 308 is similarly switched to load capacitor 296 through MOSFET switch 312, which is controlled by clock signal 316; clock signal 316 being substantially an inverted version of clock signal 246. Mixer output 300 thus alternately tracks inputs signal 238 and phase-inverted input signal 308.

Figure 7C:
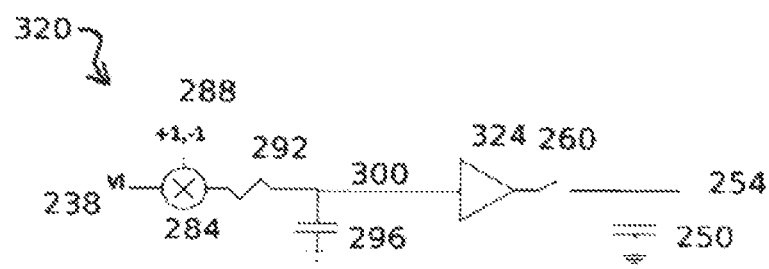

Mixer circuit 280, and its embodiment 304, lack a hold phase—its output signal vanes in all clock phases, whereas a simple sampler "holds" when the clock is low. Adding a buffer and a sampler give a practical mixer-sampler circuit FIG. 7c, shown generally at 320. In this mixer-sampler circuit 320, just as in mixer circuit 280, input signal 238 is mixed with a square wave 288 in mixer 284, the output being lowpass filtered using resistor 292 and capacitor 296 to provide a mixer output 300. Mixer output 300 is then buffered by buffer 324, which isolates the lowpass circuit, comprising resistor 292 and capacitor 296, from loading by the following track-and-hold stage; the track-and-hold stage comprising a sampling switch 260 and sampling capacitor 250, whose output voltage 254 is taken as the mixer/sampler output. Mixer 284 can be implemented as shown in FIG. 7b at 304, and sampling switch 260 as shown in FIG. 6a.

In mixer-sampler circuit shown at 320, the mixer, buffer and sample/hold can all be expected to have finite bandwidth. If each component is first-order, then the conventional mixer/sampler circuit contains an implicit third-order filter. It is proposed that this combination of mixing and sampling would be suitable for a new type of composite conversion that the present inventor refers to as "Walsh-RC sampling", in particular not requiring use of an integrate-and-dump circuit.

Whereas various combinations of idealized mixers, filters and samplers are shown above, and which may be combined to form architectures that combine subconverters into a higher-speed converter, and whereas the established mixer and sampler circuits form a mixer/filter/sampler combination not directly compatible with any of the known architectures, it is desired to find a multi-path ADC architecture which is realizable with real world structures, such as a multi-path ADC in which the mixer is constrained to switching inputs on its LO port, the filtering operation is a cascade of RC low as functions, and the sampler operates at baseband. This set of constraints defines the desired Walsh-RC architecture in accordance with the present invention.

Again, while referred to as a Walsh-RC architecture, the present invention is not limited to the use of Walsh codes and any orthogonal, or substantially orthogonal, code can be employed.

The Walsh-RC approach to combining subconverters is expected to provide advantages over the prior art in lower bandwidth requirements on sampling switches and reduced sensitivity to sampling jitter. These advantages in turn can be expected to improve performance in all three of the criteria by which analogue-to-digital conversion is generally judged; speed, because most components will be operated well below the Nyquist frequency; accuracy, due to the use of smaller sampling switches which will inject smaller errors and because of the reduced sensitivity to clock jitter; and power, because of the reduced bandwidth requirements.

The Walsh-RC technique can require substantial digital signal processing (DSP) to recover the desired signal, however digital circuitry is scaling to smaller semiconductor feature sizes better than analog circuitry and DSP is becoming the standard for correcting circuit errors in conventional architectures thus the present inventor has recognized that the Walsh-RC architecture is commercially feasible and provides numerous advantages. Further, in cases where signals will be converted to the frequency-domain before processing the Walsh-RC technique may reduce signal-processing loads.

Practical multiband conversion using Walsh clocking and the natural RC filtering of standard components will now be described. The discussion starts from integrate-and-dump sampling to first-order RC followed by DSP, and then show how mixing is incorporated. Beyond first order, the DSP becomes substantially more complicated but is still commercially feasible.

In principle, a "Cascaded Integrator-Comb" (CIC) structure can be used instead of an integrate-and-dump. Filters with this CIC structure are well known in digital filtering, and may be thought of as replacing an FIR filter of the form $1+z^{-1}+z^{-2}+\ldots+z^{1-N}$ with a mathematically equivalent $(z/(z-1))\times(1-z^{-N})$. While the first form requires N−1 additions per cycle, the second is a cascade of an integrator that requires one addition per cycle and an FIR with a long delay that also only requires one addition per cycle. This structure is also well known in downsampling operations, in which the FIR operation is performed at a lower sampling rate—e.g. with $z_N = z^N$, so that the result is a cascade of two first-order filters at different rates: $z/(z-1)\times(1-z_N^{-1})$). In a timing diagram, a CIC filter can be thought of as using the FIR $1-z_N^{-1}$ to cancel out the "tail" of a step impulse response.

Applying this idea to analog sampling, which can be regarded as the infinite-ratio case of downsampling, gives a circuit in which the output of an analog integrator (1/sT) in the Laplace domain) is sampled and the samples then digitally differentiated $(1-z^{-1})$. The result, at sampling instants, is equivalent to ideal sampling of a signal pre-filtered by a unit pulse h(t) which is defined as unity for t between 0 and sampling period T, and zero elsewhere. This function h(t) has a Laplace transform $(1-e^{-sT})/sT$, which in turn is a sin c( ) function delayed by T/2. Thus, CIC sampling in principle just pre-filters ideal sampling by sin c( ).

However, this technique of CIC filtering by analog integration followed by digital differentiation is not practical because any DC component on the input causes the integrator output to ramp up until it clips, at which point it no longer implements integration. This is not a problem in digital implementations, as shown in, "An Economical Class of Digital Filters For Decimation and Interpolation", Eugene B. Hogenauer, IEEE Transactions on Acoustic Speech and Signal Processing, Vol ASSP-29, No. 2, April 1981, because the use of residue arithmetic—e.g. conventional twos-complement arithmetic—allows overflows in the integration stage to be compensated by overflows in the FIR.

For high-frequency inputs, a second problem is that precise integration is difficult: operational-amplifier integrators are limited in bandwidth.

Accordingly, replacing the integrator in a CIC sampler with an RC low as with time constant τ, (H(s)=1/(sτ+1)) would solve two practical problems: clipping due to input DC; and the need for an operational amplifier. However a digital differentiator $1-z^{-1}$ no longer cancels the "tail" of the lowpass impulse response $$h(t) = e^{\frac{-t}{\tau}}$$

Replacing the pure differentiator $1-z^{-1}$ with a highpass $$1 - e^{\frac{-T}{\tau}} z^{-1}$$

makes cancellation of the impulse tail complete, so that the result is equivalent to ideal sampling preceded by filtering with a frustrated exponential impulse response h(t), which is $$h(t) = e^{\frac{-t}{\tau}}$$

for values of t between 0 and sampling time T and is zero elsewhere. The Laplace transform of this is $$H(s) = \frac{1 - e^{\frac{-T}{\tau}} e^{-sT}}{s\tau + 1}$$

The present inventor has determined that this technique can be used to make a variant of integrate-and-dump sampler that is practical for high-speed ADC implementation, and that is useful in itself. The bandwidth-correction techniques described in the above-referenced U.S. provisional patent application 61/300,098 may be seen in this light.

There is a design tradeoff in the choice of time constant τ: long τ>>T approximates CIC and so will reduce dynamic range by overloading for DC signals (post-mix); short τ<<T approximates sampling and so will worsen aliasing and jitter sensitivity.

For the purposes of the present invention it is desired to use the RC-Highpass enhanced integrate-and-dump described above to make a version of Walsh-domain system with RC filtering.

Similar to the lines of the discussion of analog CIC filters above, in principle one could replace the "integrate and dump" blocks of FIG. 5 with pure analog integrators followed, after the subconverters, with digital differentiators $1-z^{-1}$. However, the resulting system would have the same practical problems with clipping integrators and need for operational amplifiers as for the CIC sampler.

Figure 8:
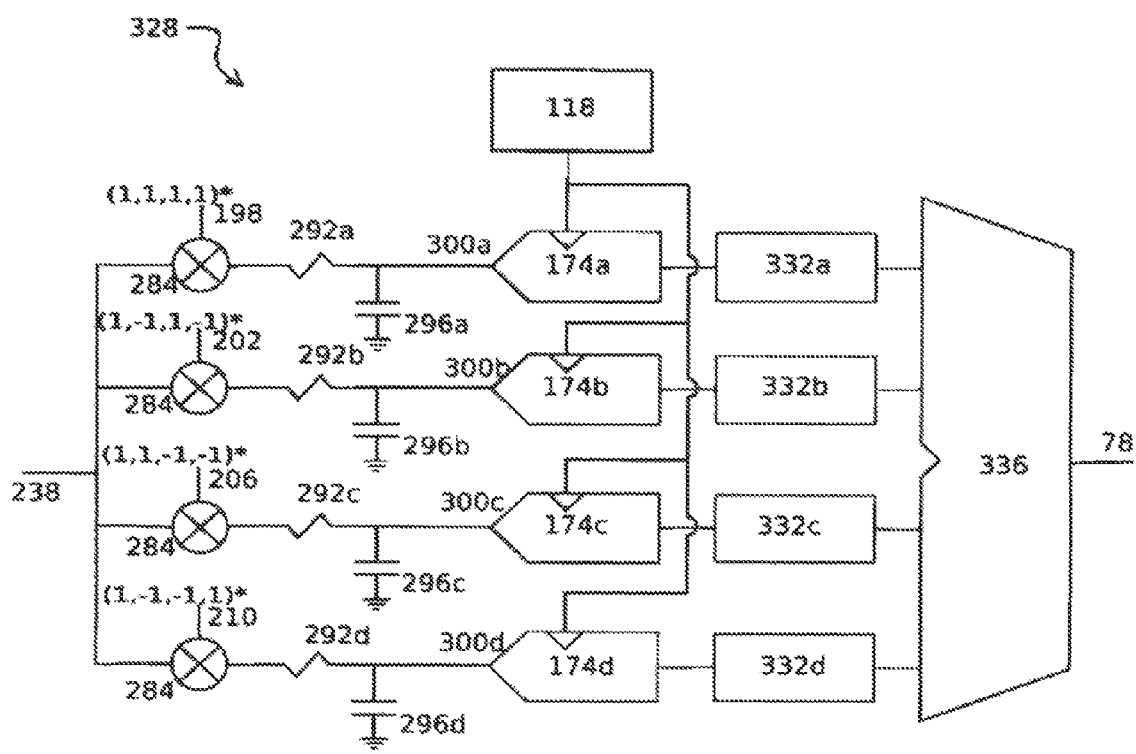
FIG. 8 shows schematic representation of an analog to digital conversion system in accordance with the present invention.

Next, the ideal integrator can be replaced with an RC lowpass filter and the ideal digital differentiator can be replaced with a matched highpass filter to obtain the ADC structure of FIG. 8.

More specifically, FIG. 8 shows a novel "Walsh-RC" analog to digital conversion system 328 comprising subconverters combined by the use of Walsh-RC sampling and digital post filtering. In this Walsh-RC analog to digital conversion system 328, input signal 238 is applied in parallel to the signal inputs of each of four mixers 284, each supplied with a distinct Walsh-type sequence, in the illustrated embodiment, the constant DC sequence 198 denoted by (1, 1, 1, 1)*, where the "*" notation denotes infinite repetition; the "$f_s/2$" sequence 202 denoted by (1, −1, 1, −1)*; the "sin f/4" sequence 206 denoted (1, 1, −1, −1)*; and the "cos f/4" sequence 210 denoted (1, −1, 1, −1)*. One skilled in the art will recognize that these are four binary orthogonal sequences, and that a simple re-ordering of phases is not material. One skilled in the art will also recognize that, while four channels are shown in the Figure, other numbers of channels are possible and are readily derived.

Output signals of the four mixer 284 drive four independent lowpass (smoothing) filters with resistors 292a, 2b, 292c and 292d respectively and capacitances 296a, 296b, 296c and 296d respectively to produce respective mixed and low-pass filtered outputs 300a, 300b, 300c and 300d. These mixed and low-pass filtered outputs 300a, 300, 300c and 300d are sampled and converted to digital form in respective subconverters 174a, 174b, 174c and 174d.

The sampling stage of the subconverters can be implemented with the buffer and track-and-hold embodiment described with respect to FIGS. 7a, 7b and 7c above. Outputs of the subconverters 174a, 174b, 174c and 174d are digital in form, and are digitally filtered by respective digital highpass filters 332a, 332b, 332c and 332d which reduce, or in first order cases remove, the sample to sample memory induced by the respective low pass filters formed by resistors 292a, 292b, 292c, 292d and capacitances 296a, 296b, 296c and 296d. As mentioned above, and as will be apparent to those of skill in the art, resistors 292 and capacitances 296 can be implicit (the result of non ideal circuit elements) or explicit or a combination of both. The outputs of these digital highpass filters are then digitally combined in combiner 336, combiner 336 operable to compensate for in-band gain variation and aliasing artifacts as will be described below. As will be apparent to those of skill in the art, highpass filters 332 can be combined and/or incorporated into combiner 336 if desired.

The combination of high pass filters 332 and combiner 336, whether separate elements or combined, is a matrix digital filter and performs the digital signal processing referred to herein. As will be apparent, high pass filters 332 can be implemented explicitly, with a suitable filter structure, or implicitly via other components of the system, such as within combiner 336, etc.

As will be apparent to those of skill in the art, subconverters 174 can alternatively be implemented in a wide variety of manners, as will occur to those of skill in the art, including, without limitation, interleaved converters, pipeline converters, flash converters or sigma-delta converters. Sigma-delta converters may be of particular interest, especially if more than twelve bits of resolution is desired. As is known to those of skill in the art, such a case, the sigma-delta converter will have a base sampling rate and will oversample the signal applied to it by some multiplier (such as sixty-four times) the base sampling rate, and the output of the sigma-delta converter is post-filtered to provide the desired output at the base sampling rate. Therefore, the term "sampling rate", when used with respect to such sigma-delta implementations, is intended to mean the base sampling rate of such sigma-delta converters.

Figure 9:
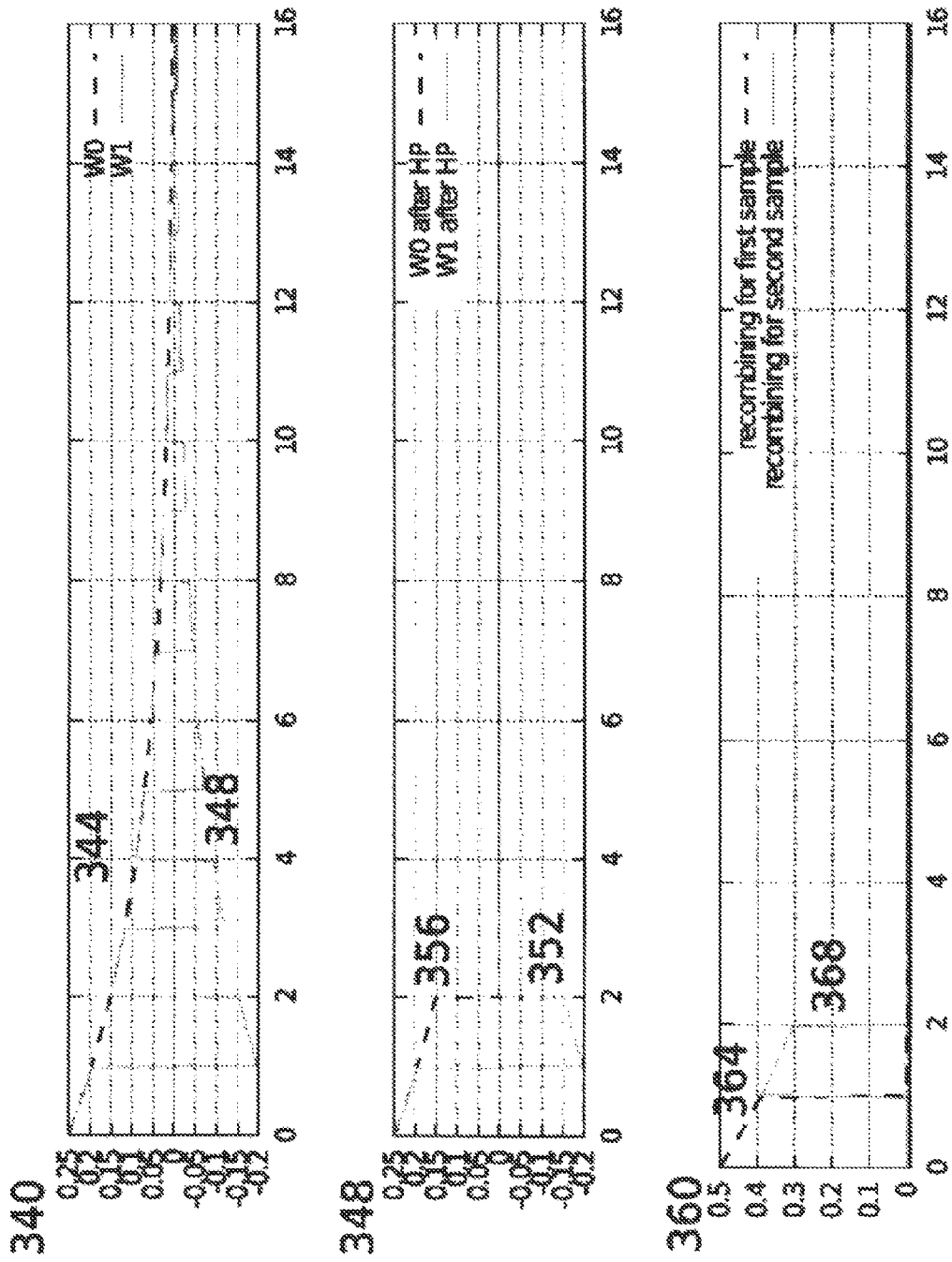
FIG. 9 shows internal impulse responses of a two-channel embodiment of the system of FIG. 8, illustrating its operation.

FIG. 9 shows internal impulse responses of a two-channel (N=2, specifically the signal path including subconverter 174a and the signal path including subconverter 174b) embodiment of the system of FIG. 8, illustrating its operation. It comprises three plots, showing impulse responses at three points in the Walsh-RC analog to digital system. Plot 340 shows impulse responses from the input to the outputs of the DC ("W0") channel at 344 and the $f_s/2$ ("W1") channel at 348 respectively, for a case with a lowpass filter with a (very slow) RC time constant of four samples.

One skilled in the art will be aware that the definition of impulse response for a continuous-time time-varying system takes two arguments: the time at which the sample is taken and the length of time before that when the Dirac impulse occurred. The ADC system of FIG. 8 is such a time system, with different impulse responses at different times. FIG. 9 shows impulse responses taken at sampling instants t=0, 2, 4, . . . , and thus represents the influence of continuous-time signals on values as sampled by the subconverters. Convolving a given continuous-time input with these functions will result in a value: the value of the output at 300a, 300b, 300c and 300d in FIG. 8 when sampled with clock 118.

The time-axis in FIG. 9 represents the time before a sampling instant when a Dirac impulse occurred in the continuous-time system input. One skilled in the art will be aware that the more familiar impulse response for a time-invariant system is defined as a function of a single variable and taken as the response going forward in time to a Dirac impulse at time zero, but will not confuse the time-varying and time-invariant cases.

Plot 348 shows the effect of the filtering of each channel with the highpass filter of the form $1-0.60653z^{-1}$, where the coefficient 0.60653 is calculated as $$e^{\frac{-T}{\tau}} = e^{-0.5}$$

as described above. The result is that the tails of the impulse responses 352 and 356 (corresponding to the DC path impulse response 344 and $f_s/2$ path impulse response 348 respectively) are cut off, leaving the system sensitive only to signals in the sampling interval 2T.

Plot 360 shows the effect of Walsh-combining the two channels using the matrix $$W = \begin{bmatrix} 1 & 1 \\ 1 & -1 \end{bmatrix}.$$

Pulse 364 is the sum of pulses 352 and 356, as defined by the first row [1, 1] of matrix W: and pulse 368 is the difference of pulses 352 and 356, as defined by the second row [1, −1] of matrix W. Pulse 364 is now non-zero only in the timeslot t=0 to t=1 and pulse 358 is non-zero only in the timeslot t=1 to t=2. Samples of the lowpass and $f_s/2$ channels processed in this way therefore represent samples of the input signal as convolved with pulses 364 and 368 respectively. It can further be seen that pulse 368 differs from pulse 364 only in timing (being shifted by one sample) and gain; pulse 368 is smaller than pulse 364 by a factor $e^{-0.25} \approx 0.7788$; this is easily corrected by modifying the recombination matrix to $$W_1 = \begin{bmatrix} 1 & 1 \\ e^{0.25} & -e^{0.25} \end{bmatrix}$$

The impulse responses 364 and 368 are not Dirac delta functions, so this sampling arrangement has an in-band frequency droop—which can be corrected digitally if necessary—and also has some built-in anti-aliasing behaviour.

Figure 10:
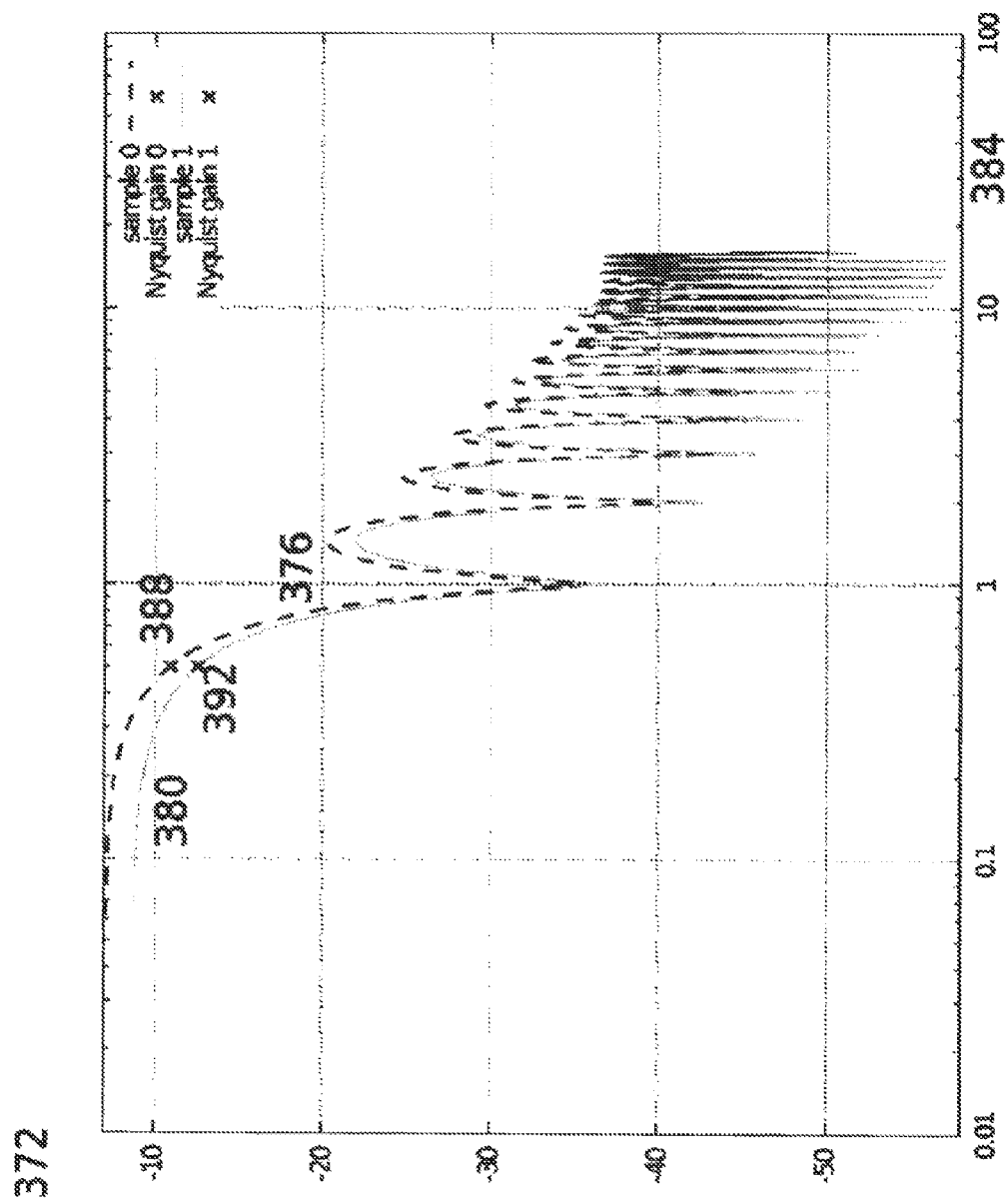
FIG. 10 shows internal frequency responses of the system of FIG. 8 with two channels.

FIG. 10 shows, at curve 372, the built-in filtering for the case of the system in FIG. 9, wherein curve 376 represents the frequency response in deciBels corresponding to the sampling pulse 364 in FIG. 9, and curve 380 represents the frequency response in deciBels corresponding to the sampling pulse 368 in FIG. 9.

Frequency axis 384 in FIG. 10 is normalized to the effective sampling frequency of the analog to digital conversion system, such that the Nyquist frequency for the overall system is 0.5. One skilled in the art will recognize that because the individual channels only sample at half of the overall rate, they individually have Nyquist frequencies of 0.25. Overall passband droop measured at the system Nyquist frequency is marked at 388 for the DC channel and at 392 for the $f_s/2$ channel.

The droop is −3.9 dB for this example, and this in-band droop is very similar to that for an integrate and dump element ($20 \log_{10} \sin c(0.5) \approx 3.9$ dB) and the out-of-band filtering is first-order, attenuating alias power at 20 dB/decade enhanced by a comb of notches {again, much like sin c( )}. The spectrum also shows that gains for channels 0 and 1 are offset—this is corrected by using the simple grain adjustment defined by matrix $W_1$ described above.

One skilled in the art will recognize that, while the embodiment described in FIGS. 9 and 10 is for a two-channel system, these results are readily extended to any number of channels.

FIG. 11 shows interns impulse responses of a system like that of FIG. 8 but having a more complicated second-order response. It shows impulse responses at various points in the signal chain for a two-channel system in which both channels are filtered by the second-order lowpass $$\frac{1}{\left(s+\frac{1}{4}\right)(s+4)}$$

(chosen so that there is a dominant pole at $$s=-\frac{1}{4},$$

which was the only pole in the development of FIGS. 9 and 10).

More specifically, plot 396 shows impulse responses 400 and 404, representing convolution kernels for evaluating sample values at sampling times from an arbitrary input signal. Pulse 400 represents the convolution kernel for the DC path while pulse train 404 represents the convolution kernel for the $f_s/2$ path.

Plot 408 shows impulse responses 412 and 416, derived from pulses 400 and 404 as corrected by digital filters having transfer function $(z-e^{-0.5})$. One skilled in the art will note that this now does a poorer job of canceling the impulse-response tail, and would expect that from the choice of a first-order digital filter to correct a second-order response, and would understand that a second-order corrector would be an appropriate choice for improved cancellation.

Plot 420 shows the result of further correction of responses 412 and 416 by multiplication by a Walsh matrix $$W = \begin{bmatrix} 1 & 1 \\ 1 & -1 \end{bmatrix}$$

to produce pulses 424 and 428 for the DC and $f_s/2$ paths respectively. One skilled in the art will recognize that the result is that Walsh reconstruction produces an impulse response for channel 0 that has a doublet form, while the response for channel 1 looks very similar to that for the single-pole case. One skilled in the an will also note that cancellation is still ideal for the "first-sample" impulse response during the second slot, from t=1 to t=2; this comes about because the impulse responses through the two mixers are assumed to match. In practice there will be a mismatch, and digital correction of this will be required.

Figure 12:
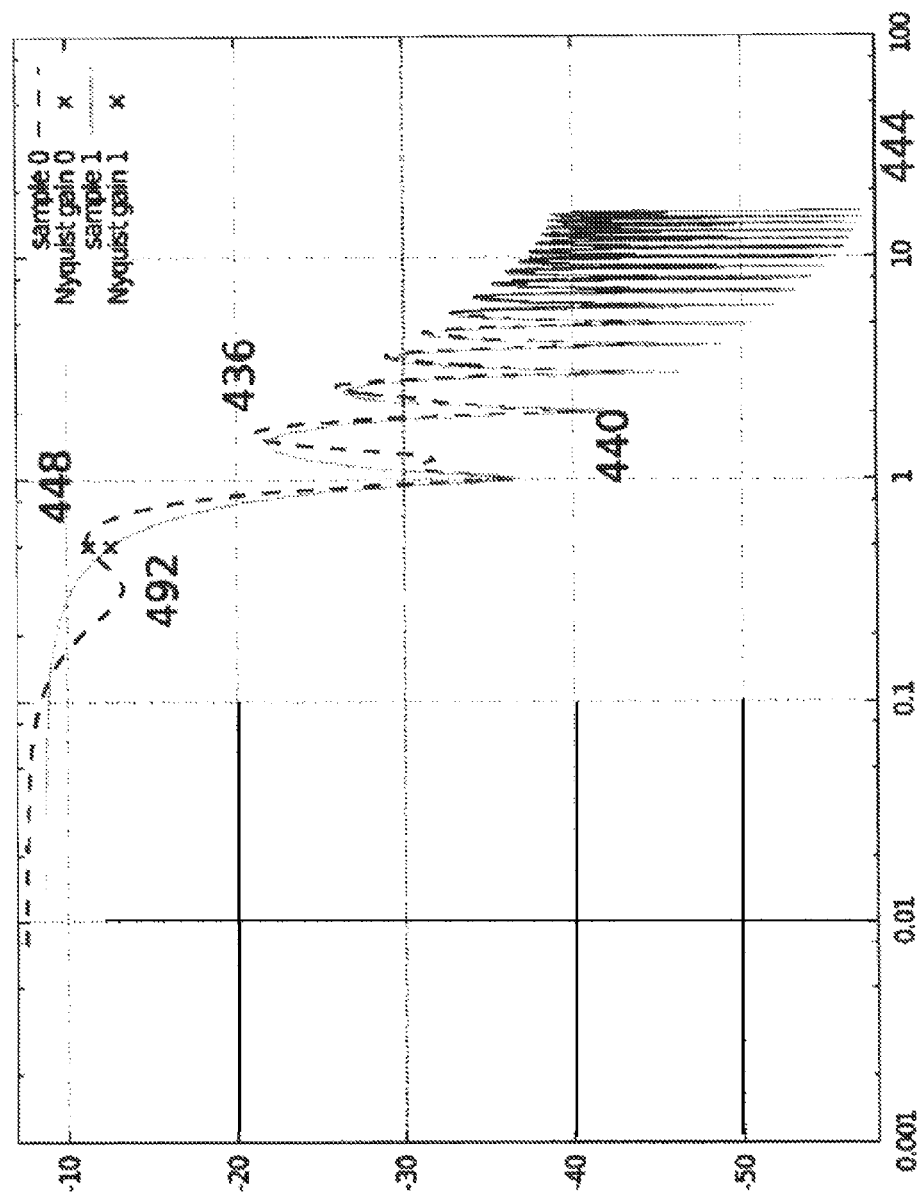
FIG. 12 shows internal frequency responses of the system of FIG. 11.

FIG. 12 shows internal frequency responses of a system corresponding to the impulse responses shown in FIG. 11. Generally, plot 432 shows frequency responses 436 and 440 corresponding to impulse responses 424 and 428 in FIG. 11, and just as in FIG. 10 frequency axis 444 is normalized to the effective sampling frequency of the system. Points 448 and 492 identify gains for the two channels at the overall Nyquist frequency, this measuring passband droop. One skied in the art will recognize that the pass and shapes are now different and therefore that correcting them to match will require additional filtering, such as could be obtained by including frequency-dependent terms in reconstruction matrix W.

Figure 13:
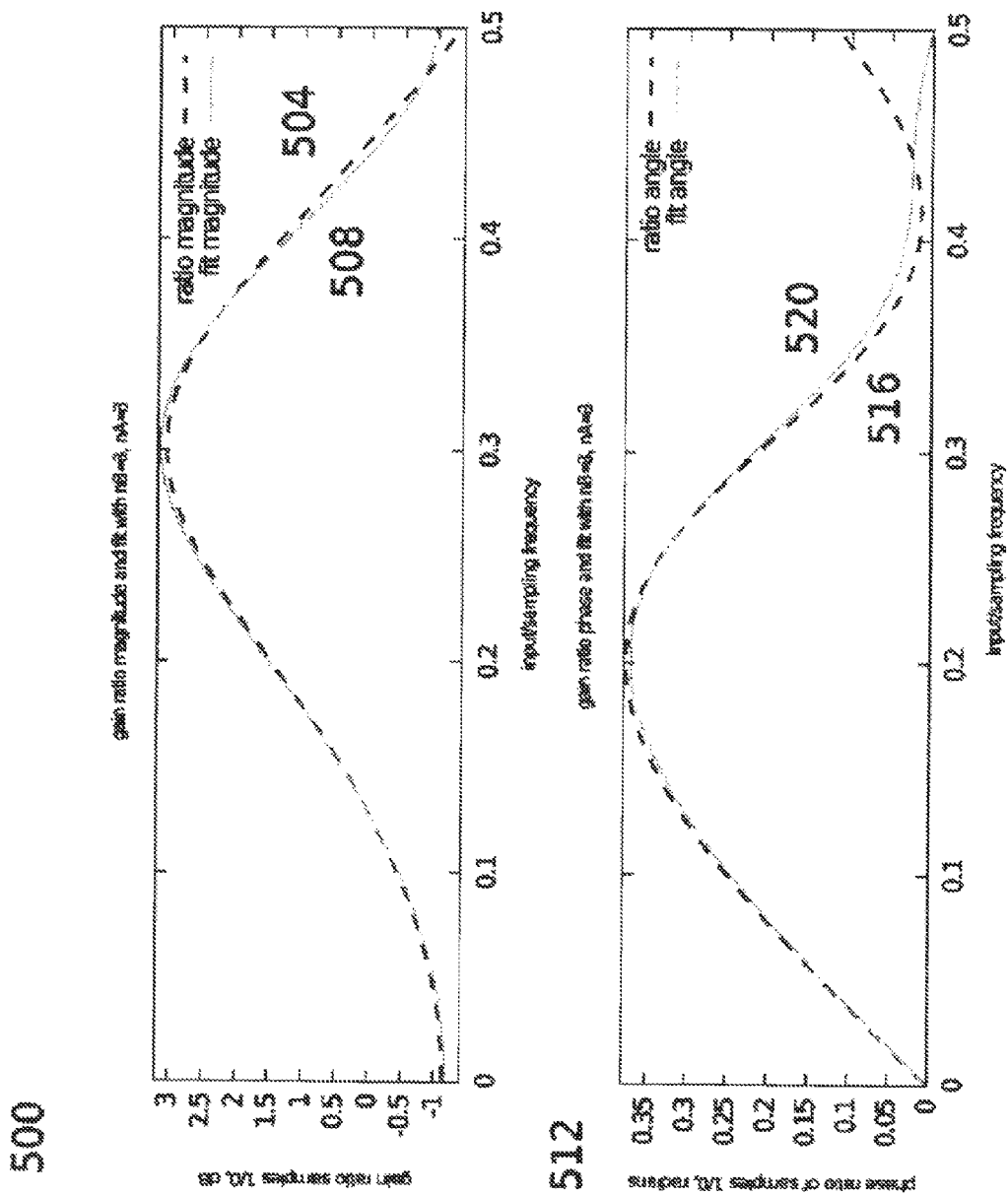
FIG. 13 shows a gain ratio, as a function of frequency, between the two channels illustrated in FIG. 12 together with a mathematical fit of a function suitable for digital correction by post-filtering.

FIG. 13 shows a gain ratio as a function of frequency between the two channels illustrated in FIG. 12 together with a mathematical fit of a function suitable for digital correction by post-filtering. More specifically, plot 500 shows the magnitude 504 of the ratio between gains 440 and 436, together with the magnitude 508 of a third-order finite impulse response filter on each channel designed to approximate the ratio between gains 440 and 436. One skilled in the art will recognize that this fit can be made arbitrarily good by increasing filter order. Generally, plot 512 shows corresponding phase responses, where curve 516 represents the phase (in radians) of the ratio between gains 440 and 436 of FIG. 12 while curve 520 represents the phase of the third-order fit whose magnitude was shown as curve 508. These correction filters may also be implemented in the frequency domain, using FFT techniques, if the order becomes high or the rest of the system is expected to operate in the frequency domain. These FIR channel-matching filters can also be designed to simultaneously flatten or match inband frequency response.

One skilled in the art will note, in FIG. 13, that the match is poor near the Nyquist frequency $0.5f_s$, and in particular that the phase match is poor. The model goes to a phase of zero, while the desired gain ratio has a phase of a little more than 0.1 radians. This is not a numerical problem, but a properly of matching paths on sampled (or downsampled) signals. The filters have to have real-valued gains at z=−1, hence phases of 0 or π, whereas the original unsampled signals can have arbitrary phase. This would not be expected to be a serious problem in practice, since signals near the Nyquist frequency would be expected to suffer from aliasing anyway because of the finite cutoff rate of practical (causal) anti-alias filters. This fundamental problem at z=−1 causes poor fit nearby, and the designer can deal with this issue by frequency-weighting the matching criterion to minimize the effort spent on matching the impossible.

Figure 14:
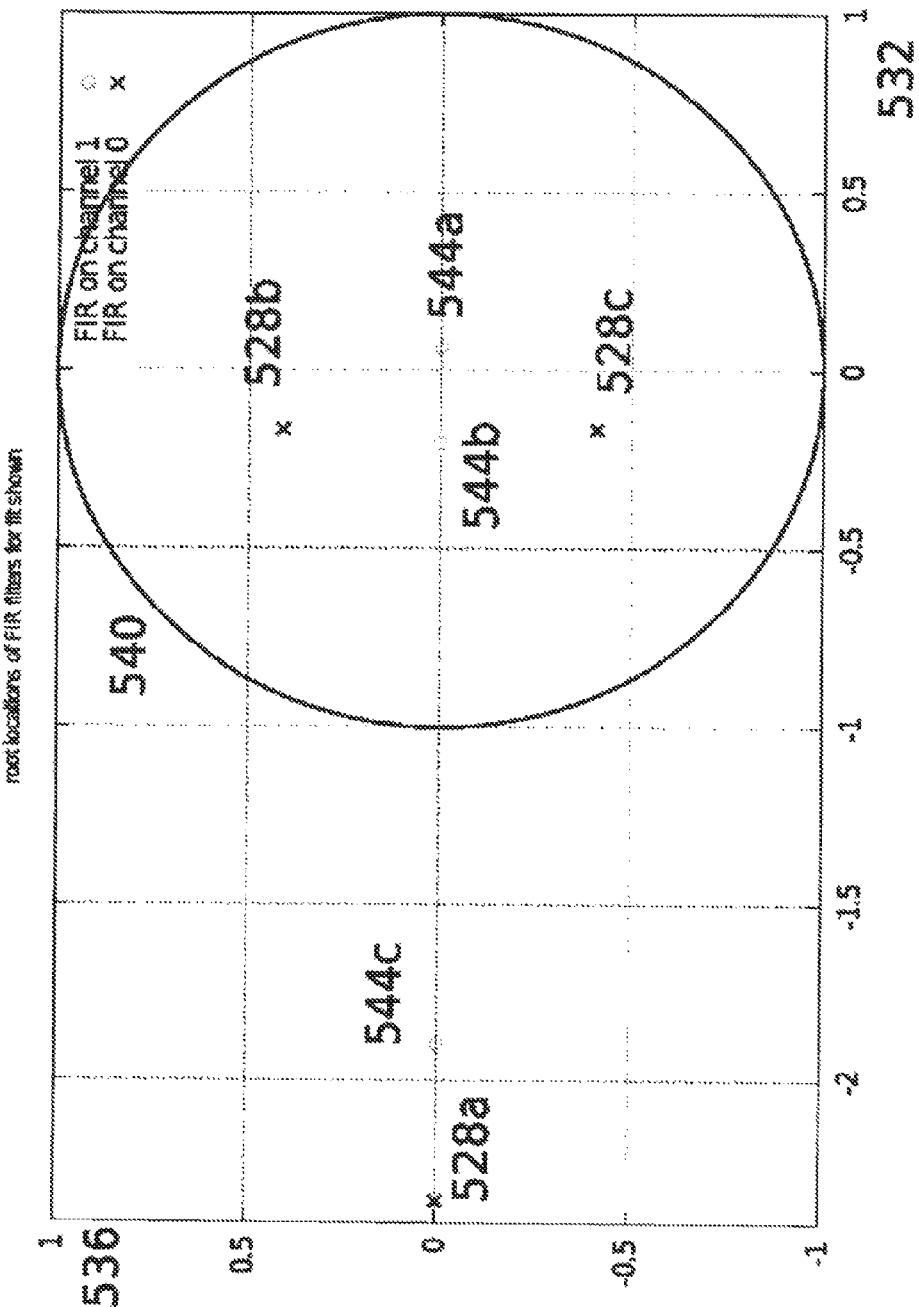
FIG. 14 illustrates the poles and zeros of the mathematical fit function of FIG. 13.

FIG. 14 illustrates the zeros of the mathematical fit functions of FIG. 13. Generally, plot 524 shows the complex values of three system zeros 528a, 528b and 528c for a function to correct the DC path having gain as shown in FIG. 12 at 448, in an Argand plane with real part shown on the x axis 532 and imaginary part on y-axis 536. Unit circle 540 marks limits of stability, which is known not be a concern for all-zero filters. Similarly, points 544a, 544b and 544c show zeros for an FIR filter correcting the $f_s/2$ path having gain as shown in FIG. 12 at 452.

Figure 15:
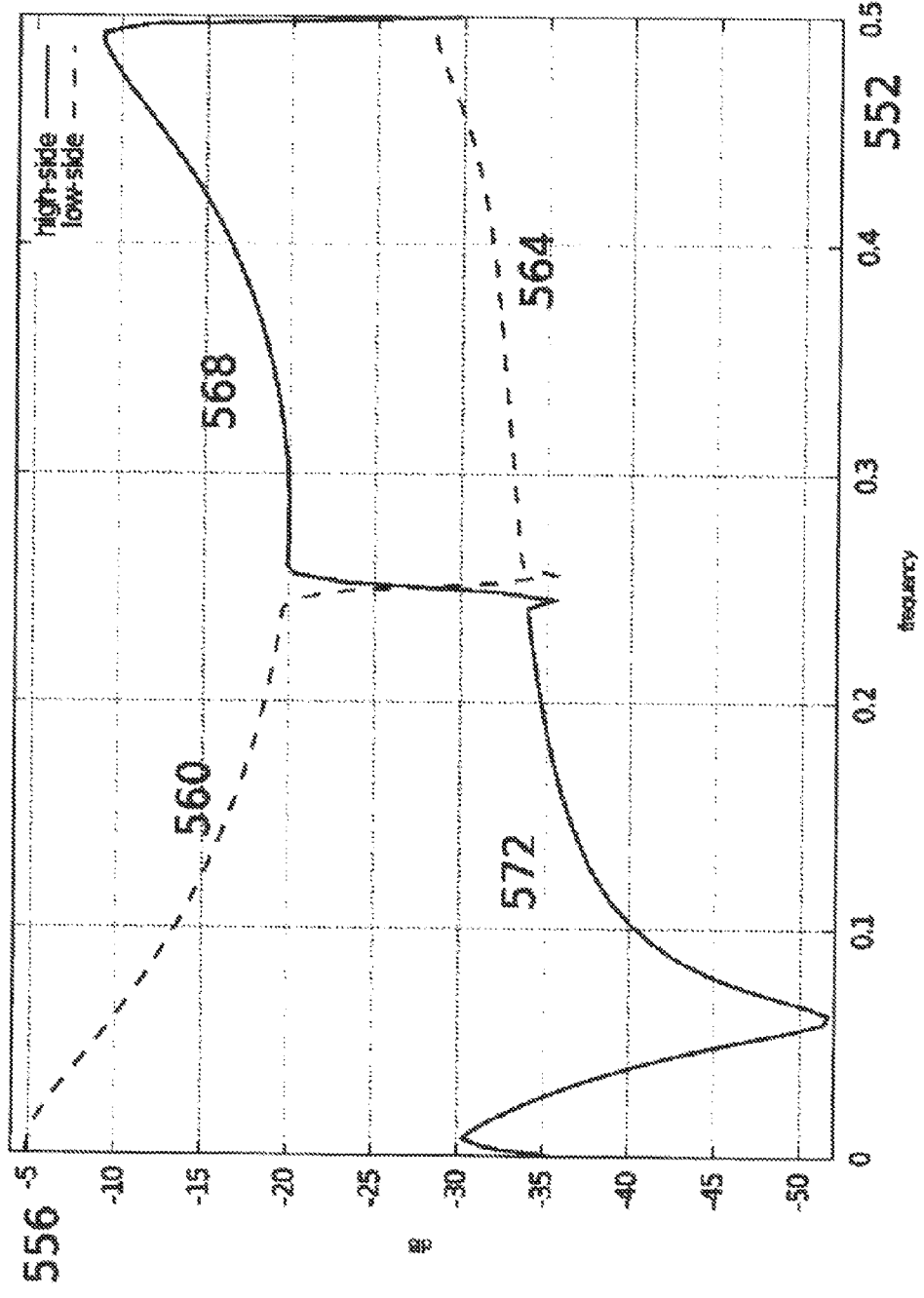
FIG. 15 shows frequency responses of the system of FIG. 12 in a representation that makes explicit the bandsplitting and aliasing behaviours of the two channels.

An alternative way to characterize the DSP required for matching is illustrated in FIG. 15, where frequency response plots are shown generally at 548, with frequency normalized to the system effective sampling rate shown on the x-axis 552 and output power in deciBels on the y-axis 556. The "low-side" plot containing segments 560 and 564 shows the spectrum at the output, assuming ideal Walsh reconstruction as shown at 424 in FIG. 11, when a $$\mathrm{sinc}\left(\frac{t}{2}\right)$$

input signal is applied at the input. This signal has a brickwall spectrum running from DC to $0.25f_s$, and so an ideal sampler should have zero power above this range, i.e. response 564 should be identically zero and hence at—infinity deciBels). In fact, it can be seen that alias energy is produced about 15 dB down.

Similarly, the "high-side" spectrum plot containing segments 568 and 572 is produced by driving the system with a signal of the form $$2\mathrm{sinc}(t) - \mathrm{sinc}\left(\frac{t}{2}\right),$$

and similarly produces an alias term 572 which is 15 dB down and which must be cancelled.

This alias-canceling view helps to understand these systems: we have two input-signal frequencies (e.g. $0.1f_s$ and $0.4f_s$, aliasing around $0.25f_s$) that contribute to two output-signal frequency components at the same places with known gains. This describes a problem of solving two equations in two unknowns. One skilled in the art will not from the curves in FIG. 15 that the matrix representing these equations is diagonally dominant—the nominal levels indicated at 560 and 568 are substantially bigger than the alias levels at 564 and 572—so the system is invertible.

Figure 16:
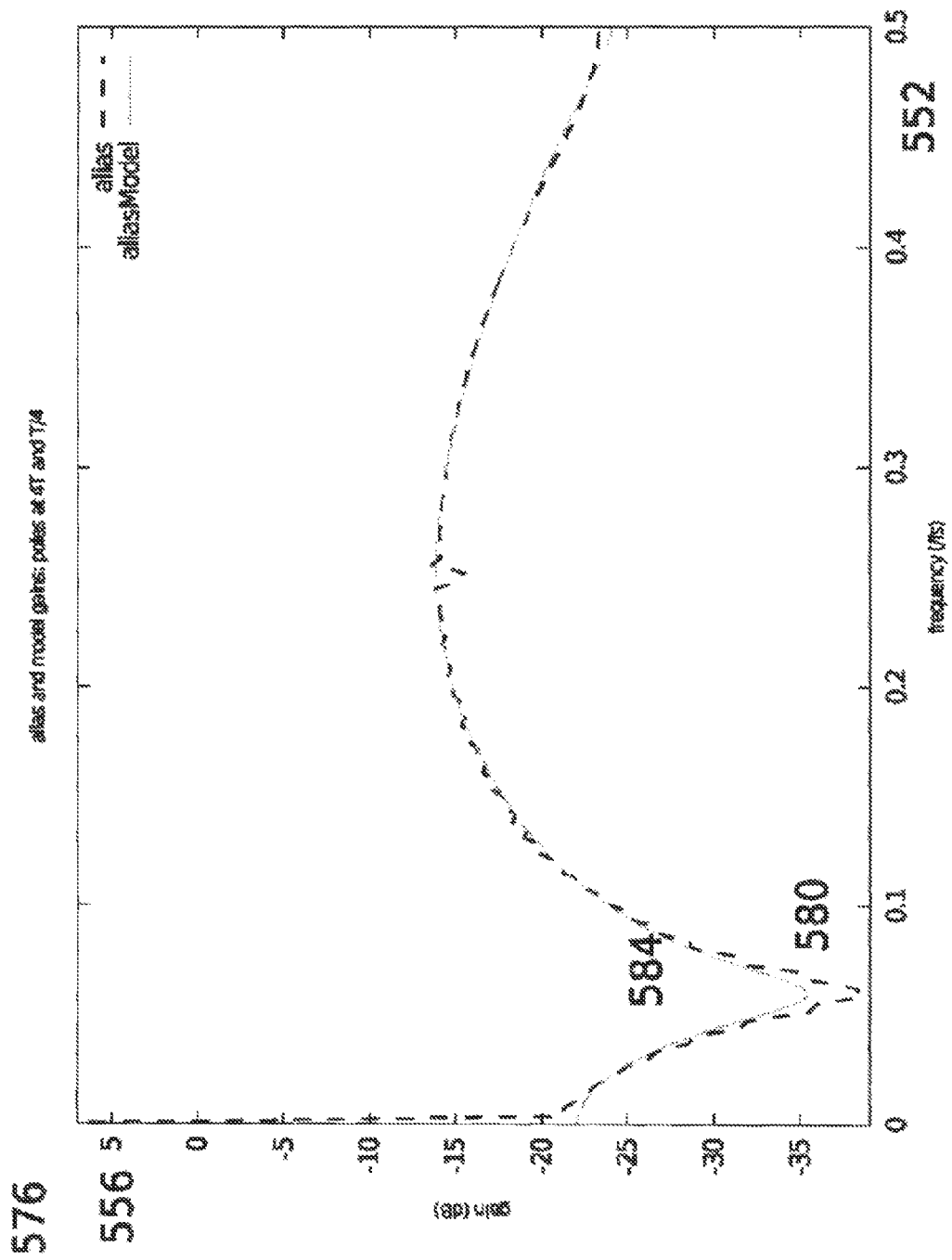
FIG. 16 shows correction of the alias terms illustrated FIG. 15 by use of a low-order matrix digital filter.

This alias-canceling view also suggests a frequency-domain correction algorithm, in which a 2×2 matrix calculation at each pair of alias frequencies in a pair of FFTs suffices to correct aliasing and to flatten frequency response. The correction coefficients in this case can simply be stored as constants or computed from a model. FIG. 16, shows generally at 576 the magnitude of aliasing gain 580 modeled with a 6th-order IIR having output magnitude 584. One skilled in the art will recognize that good modeling implies practicability of cancellation. The "scalloping" visible in 580 is a numerical effect. One skilled in the art will see that FIG. 16 shows feasibility of correction of the alias terms illustrated in FIG. 15 by use of a low-order matrix digital filter. The artifacts at DC and $f_s/4$ are due to the choice of input test signals.

The design techniques described above can be extended directly to arbitrary filtering in the mixing/sampling path. Firstly: design a practical mixer/sampler circuit and estimate its impulse responses as measured at the sampling instant, as in FIG. 11 at 396. This can be done by several methods, including by stimulating the system with half-band signals as described for FIG. 15. Secondly: estimate a digital "whitener" filter that largely cancels the trailing response, as in FIG. 11 at 408. Equivalently this can be designed to flatten the in-band frequency response. Thirdly: estimate matching filters to match the responses of the paths, per FIG. 11 at 420. This step can be combined with the "whitener" design and implemented either with FIR filters or with FFT techniques. At each of these steps there are practical design issues, such as reasonable filter order and noise gains. Designing the mixer/sampler to have a single dominant pole that is fairly slow relative to the sample rate (4T in the example of FIG. 11) produces a design that is "close" to the ideal CIC-Walsh design.

As mentioned when describing FIG. 11, practical systems will have mismatches among the various paths, and these mismatches will vary over time and from device to device. Statistically-based trimming techniques similar to those described in U.S. provisional patent application 61/300,098 can be used to estimate and correct these varying mismatches.

Figure 17:
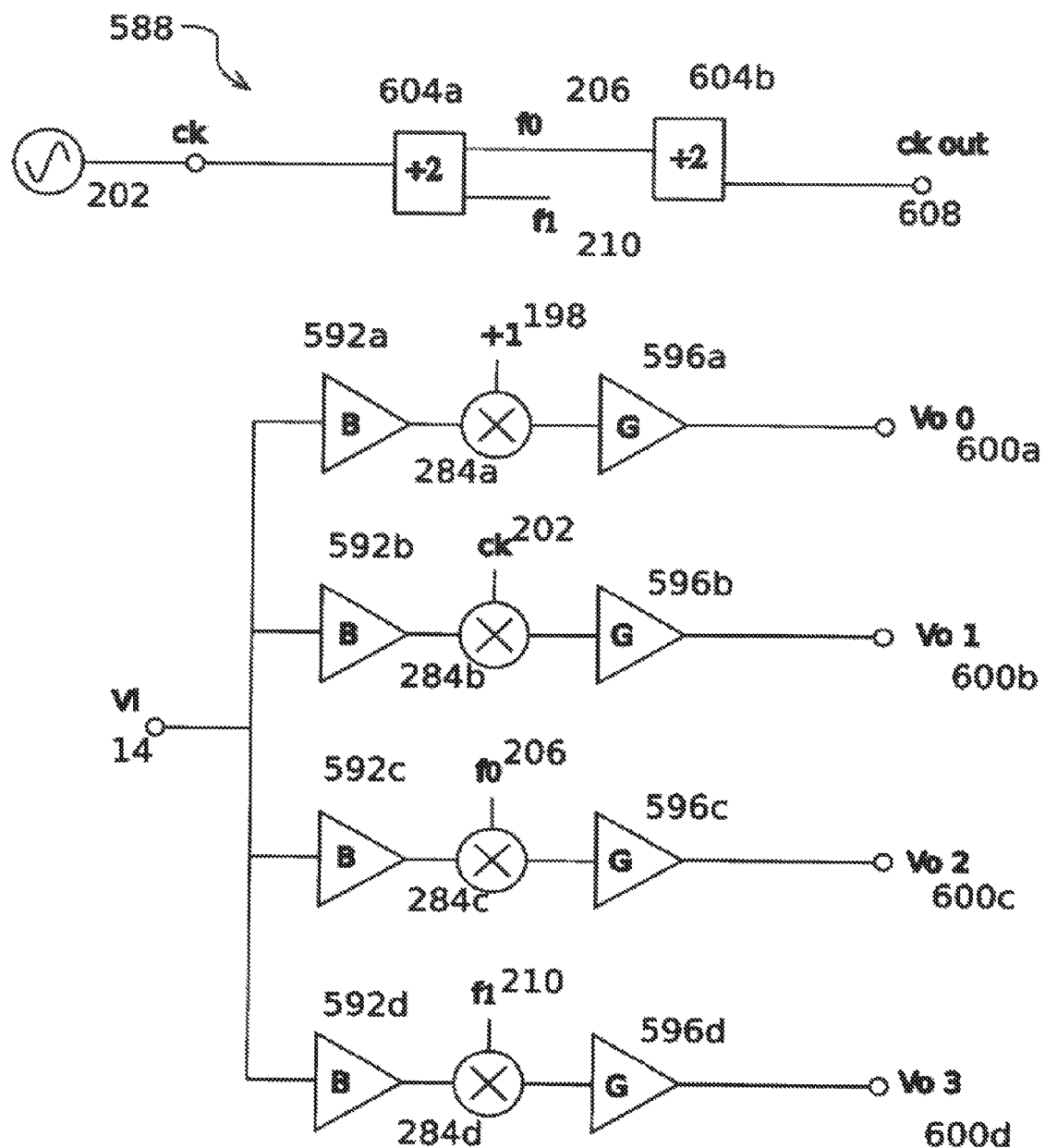
FIG. 17 shows a schematic representation of a four-channel building block for a signal distribution front end that may be used recursively to implement high-order Walsh-RC combining of subconverters into a conversion system having substantially higher sampling rates than the individual subconverters, wherein bandwidth requirements are reduced at each level of recursion.

FIG. 17 shows one implementation a presently preferred signal distribution front end for multi-path ABCs. In particular, FIG. 17 shows a unit cell 588 that splits an input signal 14 into four channels, first buffering signal 14 with four buffers 592a, 592b, 592c and 592d in order to provide power gain and isolation between channels. Individual channels are then mixed with Walsh sequences 198, 202, 206 and 210 respectively—corresponding to input tones at DC, $f_s/2$, $\cos(f_s/4)$ and $\sin(f_s/4)$—in mixers 284a, 284b, 284c and 284d. In practical systems the lowpass filtering described by resistor 292 and capacitor 295 in FIG. 7 will be present implicitly. The outputs from mixers 284a, 284b, 284c and 284d are then buffered and signal gain applied in respective gain blocks 596a, 596b, 596c and 596d to produce outputs 600a, 600b, 600c and 600d respectively.

Clock signal 202 in FIG. 17 is an input signal, but clock signals 206 and 210 may be generated from it by use of a quadrature divider 604a. Further division of divided clock 206 by another quadrature divider 604b may be used to provide a clock signal 608 suitable for driving clock input 202 of a following stage.

Unit cell 588 can be used recursively, with similar blocks attached to each output, and for this reason each stage creates an output clock signal suitable for the next stage. Cascading two stages produces 16 outputs, and cascading three stages produces 64. The cascade is then followed by 4, 16, or 64 (etc.) sampling ADCs as required. As an example, a typical high-level design, assuming that the target is 80 GHz conversion, can be developed as follows. A 4-channel first stage reduces an 80 GHz sampling problem to four 20 GHz problems; this could be one with a second stage comprising four sets of (slower) 4-channel circuits, which reduces the problem to needing 16 converters at 5 GHz; and a third stage would fan out to 64 converters at 1.25 GHz. These could be implemented with pipeline or similar converters.

Although the recursive Walsh decimation architecture of FIG. 17 is shown for four channels, it will be clear to one skilled in the art that other numbers of channels could be used. In particular, the case N=2 may be valuable.

Buffer amplifiers 592a through 592d in the architecture 588 of FIG. 17 are buffers, intended to drive mixer inputs and isolate mixers from one another; in as typical design they can have unity voltage gain, 200Ω input impedances (so that the group presents 50Ω to the input) and drive 50Ω; thus they have power gain but not voltage gain. They can typically be designed to present the non-dominant pole: for a pole at T/4 in an 80 GHz (T=12.5 ps) system this would be at 80 GHz × 4/2π50 GHz; and they have a power gain of 4, for a gain-bandwidth product of 200 GHz. Because these are front-end devices, they present the greatest circuit design challenge; if this gain-bandwidth is impractical in a given technology, then the designer may choose to reduce pole frequency—the system will work without a dominant-pole assumption, though perhaps at an increased cost in DSP—or may choose to make the first stage just two path. Gain-bandwidth products on the order of the sampling rate are feasible.

The mixers 284a through 284d are shown as unity-gain and followed by voltage-gain devices 596a through 596d. In practice the mixer and gain circuits may be folded together. The voltage-gain devices in this design would present the dominant pole: for a 4T poles as in the examples they would have bandwidths of about 3 GHz, and for reasonable signal scaling would need voltage gains of out 12 dB. If they are driving the signal inputs of similar cells there will be buffers to provide fanout, so power gain could be 12 dB or lower. These voltage.-gain devices 596 have gain-bandwidth 16× less than the buffers 592, and hence require roughly 16× less power and integrated circuit area. Voltage gain may be permissible at this point because the input signal has been filtered, and if the input spectrum is broadband then only a fraction of the input power will appear at each output 600.

It seems counter-intuitive that an output to be sampled at 20 GHz is to be driven by a 3 GHz amplifier; but in an ideal integrate-and-dump circuit the bandwidth would be zero—and the DC gain infinite. At 10 GHz—the Nyquist frequency of the 20 GHz converters needed at the outputs—these amplifiers still have a gain of 12 dB−20 $\log_{10}(|1/1+j10/3|) \approx 1$ dB.

This stage is designed to be driven by a clock at the Nyquist frequency—the system doesn't require a full-rate sampling clock or collection of phases with full-rate accuracy anywhere—and to generate the two-phase $f_s/4$ clock that it needs and also an output $f_s/8$ clock for the next stage.

A similarly-scaled next stage would require input buffers with bandwidths of about 50 GHz/4≈12.5 GHz and voltage-gain devices down at 750 MHz, and expect its outputs to be sampled at 2.5 GHz; and a third stage would only require input 3 GHz input buffers and 200 MHz voltage-gain amplifiers.

Each stage has four times as many components as its predecessor, but at ¼, of the required bandwidth; so each stage would be expected to consume a similar amount of power.

Design of the last stage interacts with design of the sampling circuit, which has different constraints. It might be desired to make the RC time-constant of the samplers fairly slow, to avoid aliasing out-of-band noise from its driver (though the drivers are already rolling off at 6 dB/octave). For 4*4*4 system the 1.25 GHz (800 ps) samplers can be designed with a 100 psec time constant, but this would still be dominated by the 200 MHz amplifiers driving them.

It is presently believed that a key advantage of this architecture over a round-robin system is in its lower requirements on the sampling stage. A 64-way round-robin system would still use 64 subconverters clocking at 1.25 GHz, but each one would be sampling a 40 GHz-wide signal rather than the output of a 200 MHz amplifier. The resulting requirements on sampler aperture and clock jitter are proportionately reduced for the Walsh-RC system: a typical (though conservative) analysis requires that the round-robin system provide 64 separate clerk signals each with jitter below $$\left(\frac{1}{2}\right)^{N-1} \pi 80 \text{ GHz} \approx 0.1 \text{ fsec}$$

and 64 samplers with similar aperture; these are very difficult requirements and often dominant. For the Walsh-RC system this reduces to the need for a single clock (with fanout 64) tolerating 64× more jitter.

The front-end $f_s/2$ node in this system is its most jitter-sensitive: but having one sensitive node is better than having 64; $f_s/2$ is better than $f_s$; and mixing is less jitter-sensitive than sampling because of its lower bandwidth.

A generalization of a Walsh/integrate-and-dump architecture is presented for high-speed multi-channel analogue-to-digital conversion. It is a modular technique designed to be well-suited to practical implementation, and reduces the most difficult requirements in a high-speed system.

In particular, FIG. 17 shows four-channel building block that may be used recursively to implement high-order Walsh-RC combining of subconverters into a conversion system having substantially higher sampling rates than the individual subconverters, wherein bandwidth requirements are reduced at each level of recursion.

The above-described embodiments of the invention are intended to be examples of the present invention and alterations and modifications may be effected thereto, by those of skill in the art, without departing from the scope of the invention which is defined solely by the claims appended hereto.

I claim:

1. A method of converting an input analog signal into a digital signal at a conversion sampling rate, the method comprising:
    distributing the analog signal into at least two signal paths;
    mixing the analog signal in at least one of the signal paths with a mixing signal;
    filtering the mixed analog signal in the at least one signal path using a smoothing filter;
    converting the analog signal in each signal path into a digital signal using an analog to digital subconverter in each signal path, each subconverter having a respective subconverter sampling rate lower than the conversion sampling rate; and
    combining the digital signals from the subconverters in each signal path to produce an overall digital output signal corresponding substantially to the input analog signal sampled at the conversion sampling rate, and compensating the overall digital output signal for aliasing artifacts.

2. The method of claim 1, wherein the mixing signal comprises at least two discrete levels.

3. The method of claim 1, wherein the mixing signal comprises one or more pure sine waves.

4. The method of claim 1, wherein the mixing signal comprises one or more clipped sine waves.

5. The method of claim 1, wherein the mixing comprises using an electrical mixer.

6. The method of claim 1, wherein the filtering comprises performing passive smoothing filtering.

7. The method of claim 6, wherein the passive smoothing filtering is achieved implicitly as part of the mixing.

8. The method of claim 1, wherein the filtering comprises performing time-invariant smoothing filtering.

9. The method of claim 1, wherein the filtering comprises performing RC smoothing filtering.

10. The method of claim 1, wherein the combining comprises employing orthogonal, or substantially orthogonal, codes to produce the overall digital output signal.

11. The method of claim 1, further comprising producing clock signals used for the mixing such that each mixed analog signal in each signal path is linearly independent of other mixed analog signals in other signal paths.

12. A method of converting an input analog signal into a digital signal at a conversion sampling rate, the method comprising:

splitting the input analog signal into at least two signal paths, the splitting comprising recursively performing:

distributing the input analog signal into at least two signal paths;

mixing the analog signal in each of the signal paths with a respective mixing signal; and filtering the mixed analog signal in each signal path using a smoothing filter to generate a respective output analog signal;

converting the output analog signal in each signal path into a digital signal using an analog to digital subconverter in each signal path, each subconverter having a respective subconverter sampling rate lower than the conversion sampling rate; and combining the digital signals from the subconverters in each signal path to produce an overall digital output signal corresponding substantially to the input analog signal sampled at the conversion sampling rate, and compensating the overall digital output signal for aliasing artifacts.

13. The method of claim 12, wherein the mixing comprises using an electrical mixer.

14. A method of converting an input analog signal into a digital signal at a conversion sampling rate, the method comprising:

receiving the input analog signal into at least two signal paths, the signal in at least one signal path being mixed with a mixing signal and smoothed implicitly as part of the mixing;

converting the analog signal in each signal path into a digital signal using an analog to digital subconverter in each signal path, each subconverter having a respective subconverter sampling rate lower than the conversion sampling rate; and combining the digital signals from the subconverters in each signal path to produce an overall digital output signal corresponding substantially to the input analog signal sampled at the conversion sampling rate, and compensating the overall digital output signal for aliasing artifacts.

15. The method of claim 14, wherein the mixing signal comprises at least two discrete levels.

16. The method of claim 14, wherein the mixing signal comprises one or more pure sine waves.

17. The method of claim 14, wherein the mixing signal comprises one or more clipped sine waves.

18. The method of claim 14, wherein the mixing is performed using an electrical mixer.

19. The method of claim 14, wherein the combining comprises employing orthogonal, or substantially orthogonal, codes to produce the overall digital output signal.

20. The method of claim 14, further comprising producing clock signals used for the mixing such that each mixed analog signal in each signal path is linearly independent of other mixed analog signals in other signal paths.

* * * * *